(12) United States Patent
Zhao

(10) Patent No.: US 12,332,569 B2
(45) Date of Patent: Jun. 17, 2025

(54) METROLOGY FOR IMPROVING DUV LASER ALIGNMENT

(71) Applicant: Cymer, LLC, San Diego, CA (US)

(72) Inventor: Zhong Quan Zhao, San Diego, CA (US)

(73) Assignee: Cymer, LLC, San Diego, CA (US)

(*) Notice: Subject to any disclaimer, the term of this patent is extended or adjusted under 35 U.S.C. 154(b) by 147 days.

(21) Appl. No.: 17/783,351

(22) PCT Filed: Dec. 9, 2020

(86) PCT No.: PCT/US2020/064126
§ 371 (c)(1),
(2) Date: Jun. 8, 2022

(87) PCT Pub. No.: WO2021/133556
PCT Pub. Date: Jul. 1, 2021

(65) Prior Publication Data
US 2023/0009554 A1    Jan. 12, 2023

Related U.S. Application Data

(60) Provisional application No. 62/953,115, filed on Dec. 23, 2019.

(51) Int. Cl.
*G03F 7/00* (2006.01)
*H01L 21/027* (2006.01)
(Continued)

(52) U.S. Cl.
CPC ...... *G03F 7/70025* (2013.01); *G03F 7/70591* (2013.01); *H01L 21/0275* (2013.01);
(Continued)

(58) Field of Classification Search
CPC ............ G03F 7/70025; G03F 7/70591; H01L 21/0275; H01S 3/0014; H01S 3/034;
(Continued)

(56) References Cited

U.S. PATENT DOCUMENTS 6,014,206 A    1/2000   Basting et al.
6,700,916 B1*  3/2004   Kramer ............... G03F 7/70525
                                                    372/57
(Continued)

FOREIGN PATENT DOCUMENTS

CN    108963727 A    12/2018
CN    108963728 A    12/2018
(Continued)

OTHER PUBLICATIONS

Denis Herve, European International Searching Authority, International Search Report and Written Opinion, counterpart PCT Application No. PCT/US2020/064126, mailed Jun. 8, 2021, 18 pages total.

(Continued)

*Primary Examiner* — Deoram Persaud
(74) *Attorney, Agent, or Firm* — DiBerardino McGovern IP Group LLC

(57) ABSTRACT

A light source apparatus includes a gas discharge stage, a sensing apparatus, an optical arrangement, an adjustment apparatus, and a control apparatus. The gas discharge stage includes an optical amplifier including a chamber configured to hold a gas discharge medium outputting a light beam, and a set of optical elements configured to form an optical resonator around the optical amplifier. The optical arrangement is configured to image light from a plurality of distinct object planes within the gas discharge stage onto the sensing apparatus. The adjustment apparatus is in physical communication with one or more optical components within the gas discharge stage and is configured to modify at least one geometric aspect of the optical components. The control apparatus is communication with the sensing apparatus and the adjustment apparatus and is configured to provide a (Continued)

signal to the adjustment apparatus based on an output from the sensing apparatus.

22 Claims, 8 Drawing Sheets

(51) Int. Cl.
    *H01S 3/00*             (2006.01)
    *H01S 3/034*          (2006.01)
    *H01S 3/139*          (2006.01)

(52) U.S. Cl.
    CPC ............ *H01S 3/0014* (2013.01); *H01S 3/034* (2013.01); *H01S 3/139* (2013.01)

(58) Field of Classification Search
    CPC .. H01S 3/08004; H01S 3/08009; H01S 3/086; H01S 3/105; H01S 3/1305; H01S 3/139; H01S 3/225; H01S 3/2333; H01S 3/2391
    See application file for complete search history.

(56) References Cited

U.S. PATENT DOCUMENTS

| | | |
|---|---|---|
| 7,819,945 B2 | 10/2010 | Morton et al. |
| 7,885,309 B2 | 2/2011 | Ershov et al. |
| 8,126,027 B2 | 2/2012 | Algots et al. |
| 2003/0138019 A1 | 7/2003 | Rylov et al. |
| 2004/0174919 A1 | 9/2004 | Knowles et al. |
| 2013/0208742 A1* | 8/2013 | Mizoguchi ............ H01S 3/0071 372/27 |
| 2018/0017875 A1 | 1/2018 | Bibby et al. |
| 2018/0017878 A1* | 1/2018 | Bibby, Jr. ............. G03F 7/7015 |
| 2019/0310558 A1 | 10/2019 | Bibby, Jr. et al. |
| 2023/0223734 A1* | 7/2023 | Teng ...................... H01S 3/1305 372/9 |
| 2024/0006838 A1* | 1/2024 | Simonelli ............... H01S 3/225 |
| 2024/0291226 A1* | 8/2024 | Chen ....................... H01S 3/134 |

FOREIGN PATENT DOCUMENTS

| | | |
|---|---|---|
| JP | S4838266 B1 | 11/1973 |
| JP | 2000114636 A | 4/2000 |
| JP | 2001129338 A | 5/2001 |
| JP | 2005502208 A | 1/2005 |
| JP | 2007021380 A | 2/2007 |
| JP | 2008263066 A | 10/2008 |
| JP | 2008277618 A | 11/2008 |
| JP | 2012156531 A | 8/2012 |
| JP | 2019523434 A | 8/2019 |
| WO | 2020055540 | 3/2020 |

OTHER PUBLICATIONS

Examiner Akira Imai, Japan Patent Office, Office Action, Counterpart Japanese Patent Application No. 2022-534450, mailed Aug. 14, 2023, 11 pages total (including English translation of 6 pages).

* cited by examiner

METROLOGY FOR IMPROVING DUV LASER ALIGNMENT

CROSS REFERENCE TO RELATED APPLICATIONS

This application claims priority to U.S. Application No. 62/953,115 filed Dec. 23, 2019 and titled METROLOGY FOR IMPROVING DUV LASER ALIGNMENT, which is incorporated herein in its entirety by reference.

FIELD

The present disclosure relates to alignment of light source apparatuses and systems, for example, a light source for lithographic apparatuses and systems.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern of a patterning device (e.g., a mask, a reticle) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, deep ultraviolet (DUV) radiation with a wavelength of 193 nm.

A master oscillator power amplifier (MOPA) is a two-stage optical resonator arrangement that produces a highly coherent amplified light beam. The performance of the MOPA can depend critically on the alignment of the master oscillator (MO). Alignment of the MO can include alignment of a gas discharge chamber, alignment of an input/output optical element, and alignment of a spectral feature adjuster.

However, alignment of the MO can be time consuming and require several hours of manual maintenance. Further, monitoring and adjustment of the MO alignment can inhibit or block the outputted light beam, for example, to a DUV lithographic apparatus.

SUMMARY

Accordingly, there is a need to reduce alignment times and alignment variations of a master oscillator over time, and monitor and dynamically control quantifiable alignment errors of the master oscillator.

In some embodiments, a light source apparatus includes a gas discharge stage, a sensing apparatus, an optical arrangement, an adjustment apparatus, and a control apparatus. The gas discharge stage includes an optical amplifier including a chamber configured to hold a gas discharge medium, the gas discharge medium outputting a light beam, and a set of optical elements configured to form an optical resonator around the optical amplifier. The optical arrangement is configured to image light from a plurality of distinct object planes within the gas discharge stage onto the sensing apparatus. The adjustment apparatus is in physical communication with one or more optical components within the gas discharge stage and is configured to modify at least one geometric aspect of the optical components. The control apparatus is in communication with the sensing apparatus and the adjustment apparatus. The control apparatus is configured to provide a signal to the adjustment apparatus based on an output from the sensing apparatus.

In some embodiments, the chamber of the gas discharge stage comprises a first optical port and a second optical port. In some embodiments, the set of optical elements includes an input/output optical element in optical communication with a first optical port, and a spectral feature adjuster in optical communication with a second optical port. In some embodiments, the optical arrangement includes one or more focusing optical elements that are adjustable along an optical path of the light beam to thereby select which object plane is imaged onto the sensing apparatus.

In some embodiments, the sensing apparatus includes a camera that senses a two-dimensional representation of the light beam received by the sensing apparatus. In some embodiments, the camera includes a charged coupled device (CCD) or a complementary metal-oxide-semiconductor (CMOS) camera.

In some embodiments, the sensing apparatus and the optical arrangement are integrated within a three-dimensional frame that also houses the gas discharge stage. In some embodiments, the light source apparatus further includes an illuminator configured to direct imaging light into the gas discharge stage.

In some embodiments, an imaging apparatus includes an illuminator, a sensing apparatus, and an optical arrangement. The illuminator is configured to direct imaging light into a gas discharge stage outputting a light beam. The sensing apparatus is configured to receive the light beam and/or imaging light. The optical arrangement is configured to image the light beam and/or imaging light from a plurality of distinct object planes within the gas discharge stage onto the sensing apparatus.

In some embodiments, the sensing apparatus and the optical arrangement are configured to receive amplified spontaneous emission (ASE) from the gas discharge stage for an initial calibration. In some embodiments, the optical arrangement includes one or more focusing optical elements that are adjustable along an optical path of the light beam to thereby select which object plane is imaged onto the sensing apparatus.

In some embodiments, the sensing apparatus includes a camera that senses a two-dimensional representation of the light beam received by the sensing apparatus. In some embodiments, the camera includes a charged coupled device (CCD) or a complementary metal-oxide-semiconductor (CMOS) camera.

In some embodiments, an imaging apparatus is integrated within a three-dimensional frame that also houses the gas discharge stage.

In some embodiments, a method of aligning a gas discharge stage outputting a light beam and including a chamber having a first optical port and a second optical port, an input/output optical element in optical communication with the first optical port, and a spectral feature adjuster in optical communication with the second optical port, includes aligning both imaging light from an imaging apparatus and amplified spontaneous emission (ASE) from the chamber with a first aperture of the input/output optical element and a second aperture of the spectral feature adjuster. In some embodiments, the method further includes aligning the input/output optical element at the first aperture with imaging light. In some embodiments, the method further includes aligning the spectral feature adjuster at the second aperture and the chamber with the light beam.

In some embodiments, the aligning both imaging light and ASE includes using ASE as a beacon to guide bore-sighting imaging light with an optical axis of the gas discharge stage and coarsely adjusting the chamber along the optical axis of the gas discharge stage. In some embodiments, the aligning both imaging light and ASE includes adjusting imaging light with an optical arrangement to center imaging light on first and second apertures.

In some embodiments, the aligning the input/output optical element at the first aperture includes inserting a retroreflector into imaging light and focusing imaging light onto a sensing apparatus to define a first alignment position. In some embodiments, the aligning the input/output optical element at the first aperture includes removing the retroreflector and adjusting the input/output optical element at the first aperture to align a back reflection of imaging light onto the sensing apparatus from a second alignment position to the first alignment position. In some embodiments, the aligning the input/output optical element at the first aperture includes imaging a far-field back reflection of imaging light from the input/output optical element at the first aperture onto the sensing apparatus.

In some embodiments, the aligning the spectral feature adjuster at the second aperture and the chamber includes profiling the light beam at the first aperture and/or at the second aperture onto a sensing apparatus. In some embodiments, the profiling the light beam includes measuring a vertical symmetry of the light beam at the first aperture and adjusting the spectral feature adjuster at the second aperture with a tilt angular modulator (TAM). In some embodiments, the measuring the vertical symmetry includes imaging a near-field beam profile of the light beam at the first aperture. In some embodiments, the profiling the light beam includes measuring a horizontal symmetry of the light beam at the first aperture and finely adjusting the chamber. In some embodiments, the measuring the horizontal symmetry includes imaging a near-field beam profile of the light beam at the first aperture. In some embodiments, the profiling the light beam includes measuring a horizontal symmetry of the light beam at the second aperture and finely adjusting the chamber. In some embodiments, the measuring the horizontal symmetry includes imaging a near-field beam profile of the light beam at the second aperture.

In some embodiments, the aligning the spectral feature adjuster at the second aperture and the chamber occurs simultaneously with the light beam being utilized in a lithographic apparatus.

Implementations of any of the techniques described above may include an EUV light source, a DUV light source, a system, a method, a process, a device, and/or an apparatus. The details of one or more implementations are set forth in the accompanying drawings and the description below. Other features will be apparent from the description and drawings, and from the claims.

Further features and exemplary aspects of the embodiments, as well as the structure and operation of various embodiments, are described in detail below with reference to the accompanying drawings. It is noted that the embodiments are not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the embodiments and, together with the description, further serve to explain the principles of the embodiments and to enable a person skilled in the relevant art(s) to make and use the embodiments.

Figure 1:
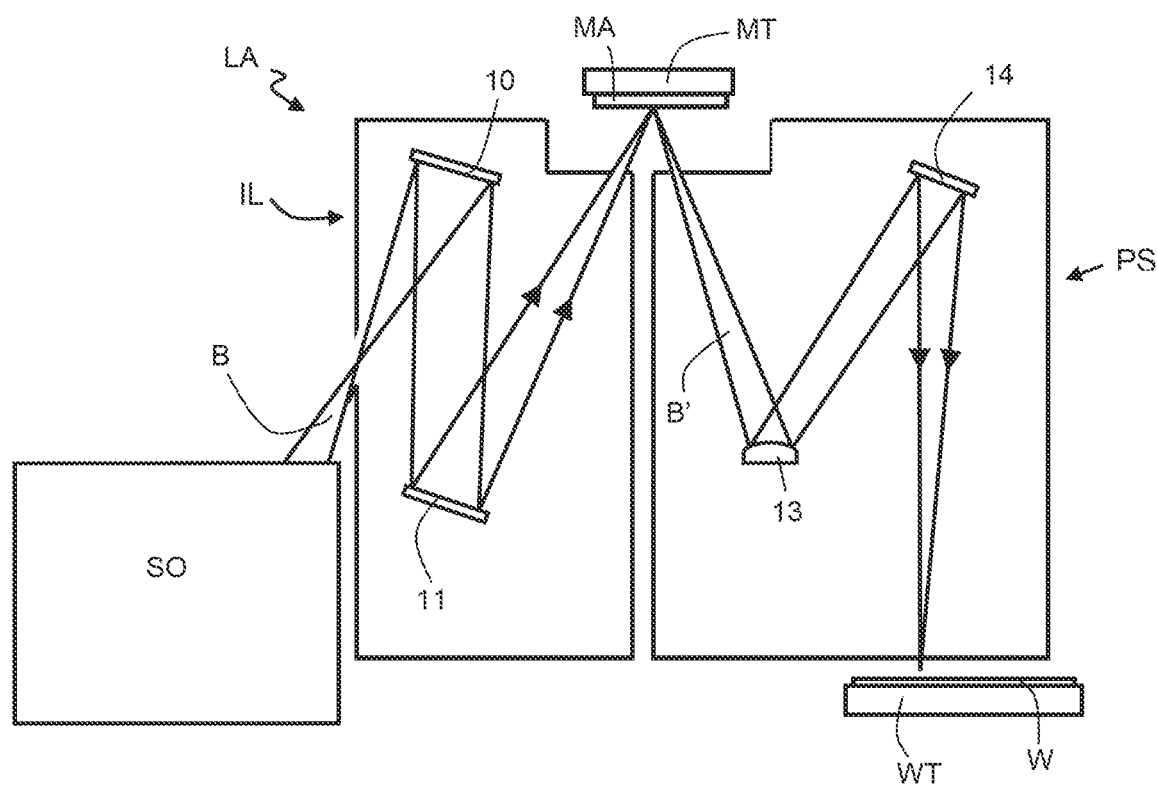
FIG. 1 is a schematic illustration of a lithographic apparatus, according to an exemplary embodiment.

The features and exemplary aspects of the embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this present invention. The disclosed embodiment(s) merely exemplify the present invention. The scope of the invention is not limited to the disclosed embodiment(s). The present invention is defined by the claims appended hereto.

The embodiment(s) described, and references in the specification to "one embodiment," "an embodiment," "an exemplary embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" or "substantially" or "approximately" as used herein indicates the value of a given quantity that can vary based on a particular technology. Based on the particular technology, the term "about" or "substantially" or "approximately" can indicate a value of a given quantity that varies within, for example, 1-15% of the value (e.g., ±1%, ±2%, ±5%, ±10%, or ±15% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Exemplary Lithographic System

FIG. 1 shows a lithographic system comprising a radiation source SO and a lithographic apparatus LA. The radiation source SO is configured to generate an EUV and/or a DUV radiation beam B and to supply the EUV and/or DUV radiation beam B to the lithographic apparatus LA. The lithographic apparatus LA comprises an illumination system IL, a support structure MT configured to support a patterning device MA (e.g., a mask), a projection system PS, and a substrate table WT configured to support a substrate W.

The illumination system IL is configured to condition the EUV and/or DUV radiation beam B before the EUV and/or DUV radiation beam B is incident upon the patterning device MA. Thereto, the illumination system IL may include a faceted field mirror device 10 and a faceted pupil mirror device 11. The faceted field mirror device 10 and faceted pupil mirror device 11 together provide the EUV and/or DUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV and/or DUV radiation beam B interacts with the patterning device MA (e.g., a transmissive mask for DUV, or a reflective mask for EUV). As a result of this interaction, a patterned EUV and/or DUV radiation beam B' is generated. The projection system PS is configured to project the patterned EUV and/or DUV radiation beam B' onto the substrate W. For that purpose, the projection system PS may comprise a plurality of mirrors 13, 14 which are configured to project the patterned EUV and/or DUV radiation beam B' onto the substrate W held by the substrate table WT. The projection system PS may apply a reduction factor to the patterned EUV and/or DUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV and/or DUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

Exemplary Light Source Apparatus

As discussed above, a master oscillator power amplifier (MOPA) is a two-stage optical resonator arrangement. The master oscillator (MO) (e.g., first optical resonator stage) produces a highly coherent light beam (e.g., from a seed laser). The power amplifier (PA) (e.g., second optical resonator stage) increases the optical power of the light beam while preserving the beam properties. The MO can include a gas discharge chamber, an input/output optical element (e.g., optical coupler (OC)), and a spectral feature adjuster (e.g., linewidth narrowing module (LNM)). The input/output optical element and the spectral feature adjuster can surround the gas discharge chamber to form an optical resonator.

Performance of the MOPA depends critically on the alignment of the MO. Alignment of the MO can include alignment of the gas discharge chamber, alignment of the OC, and alignment of the LNM. Each of the alignments (e.g., chamber, OC, LNM, etc.) can contribute to alignment errors and variations in the MO over time. However, alignment of the MO can be time consuming and require several hours of manual maintenance (e.g., synchronized performance maintenance (SPM)). Additionally, initial alignment can be difficult (e.g., trial and error) if the chamber, OC, and LNM are drastically misaligned (e.g., no initial reference point). Further, monitoring and adjustment of the MO alignment can inhibit (e.g., block) the outputted light beam (e.g., a DUV light beam), for example, to a DUV lithographic apparatus.

Imaging light (e.g., visual laser beam) can be projected on the chamber, OC, and LNM (e.g., sequentially or simultaneously) to illuminate and direct alignment of the OC and/or the LNM along an optical axis of the chamber (e.g., first and second optical ports). Amplified spontaneous emission (ASE) from the gas discharge chamber can act as a beacon (e.g., reference point) to facilitate boresighting (e.g., laser boresighting) of the imaging light along an optical axis of the MO cavity (e.g., along the optical axis of the chamber, the OC, and the LNM). Additionally, the ASE can be used to initially align the chamber with the optical axis of the MO cavity (e.g., coarse alignment). Further, a sensing apparatus (e.g., a camera) can be used to visually investigate different object planes within the MO (e.g., chamber ports, OC aperture, LNM aperture, etc.) and quantify any alignment errors (e.g., image comparison). For example, the sensing apparatus can investigate near-field (NF) and far-field (FF) regions of imaging light on the various object planes and apply adjustments (e.g., fine alignment), for example, by beam profiling (e.g., horizontal symmetry, vertical symmetry, etc.).

Light source apparatuses and systems as discussed below can reduce alignment times (e.g., SPM) of a master oscillator, reduce alignment variations in the master oscillator over time, and monitor and dynamically control quantifiable alignment errors of the master oscillator to provide a highly coherent light beam, for example, to a DUV lithographic apparatus.

Figure 2:
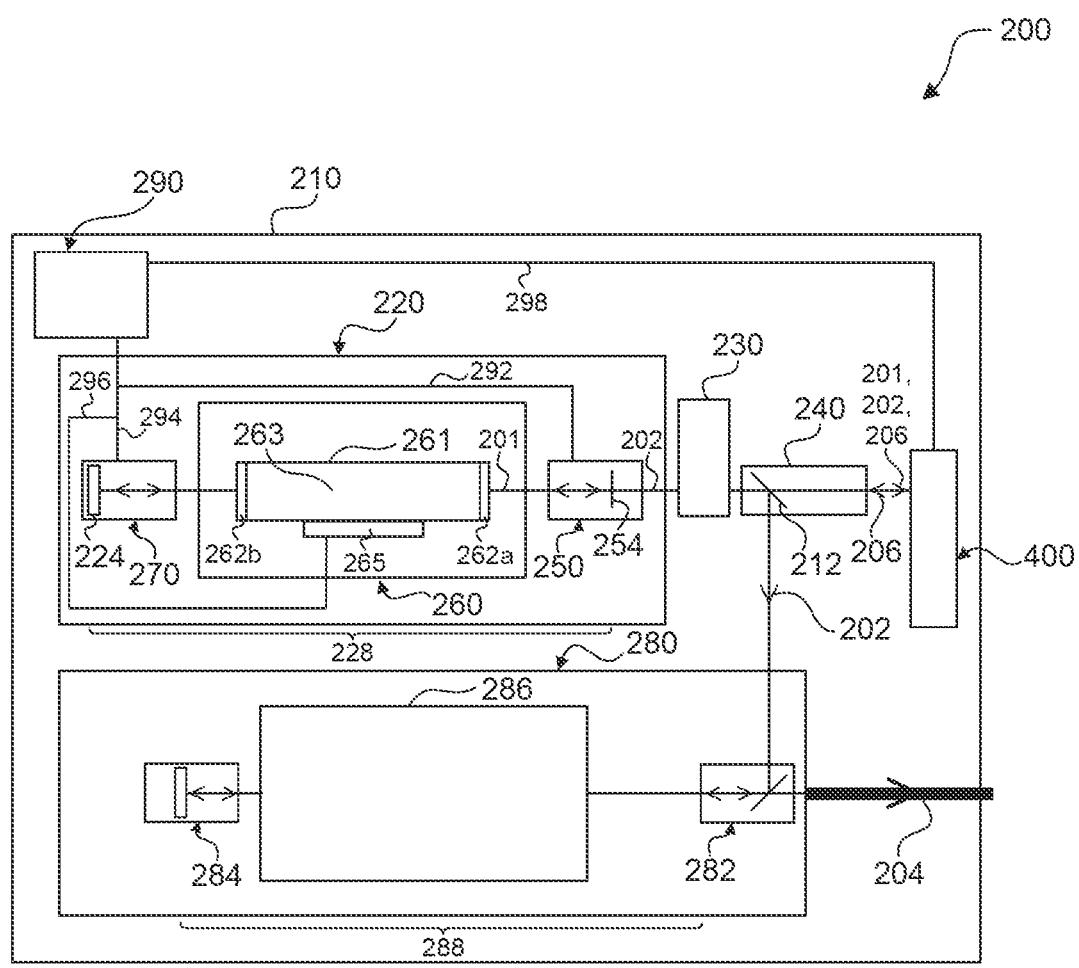
FIG. 2 is a schematic top plan illustration of a light source apparatus, according to an exemplary embodiment.
Figure 3:
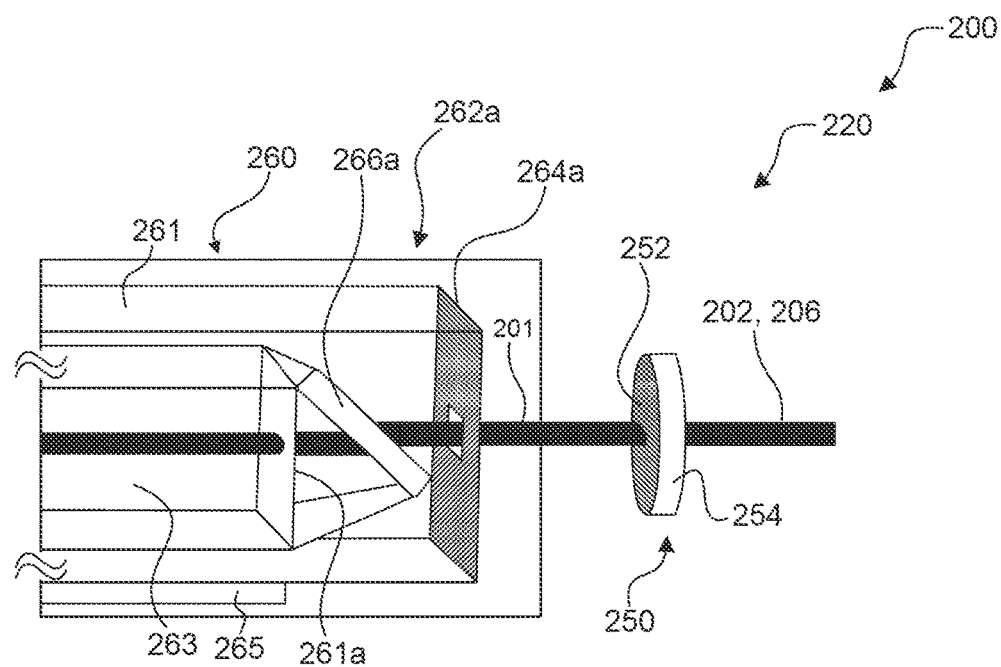
FIG. 3 is a schematic partial cross-sectional illustration of a gas discharge stage of the light source apparatus shown in FIG. 2, according to an exemplary embodiment.
Figure 4:
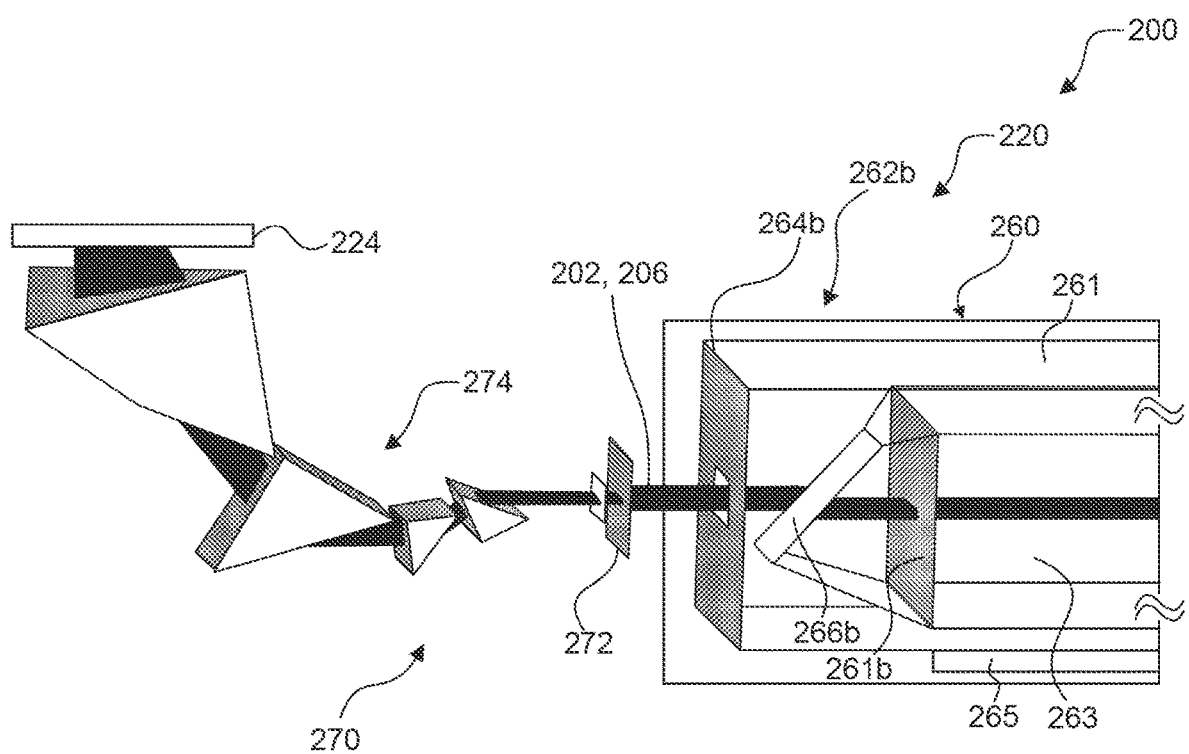
FIG. 4 is a schematic partial cross-sectional illustration of a gas discharge stage of the light source apparatus shown in FIG. 2, according to an exemplary embodiment.
Figure 5:
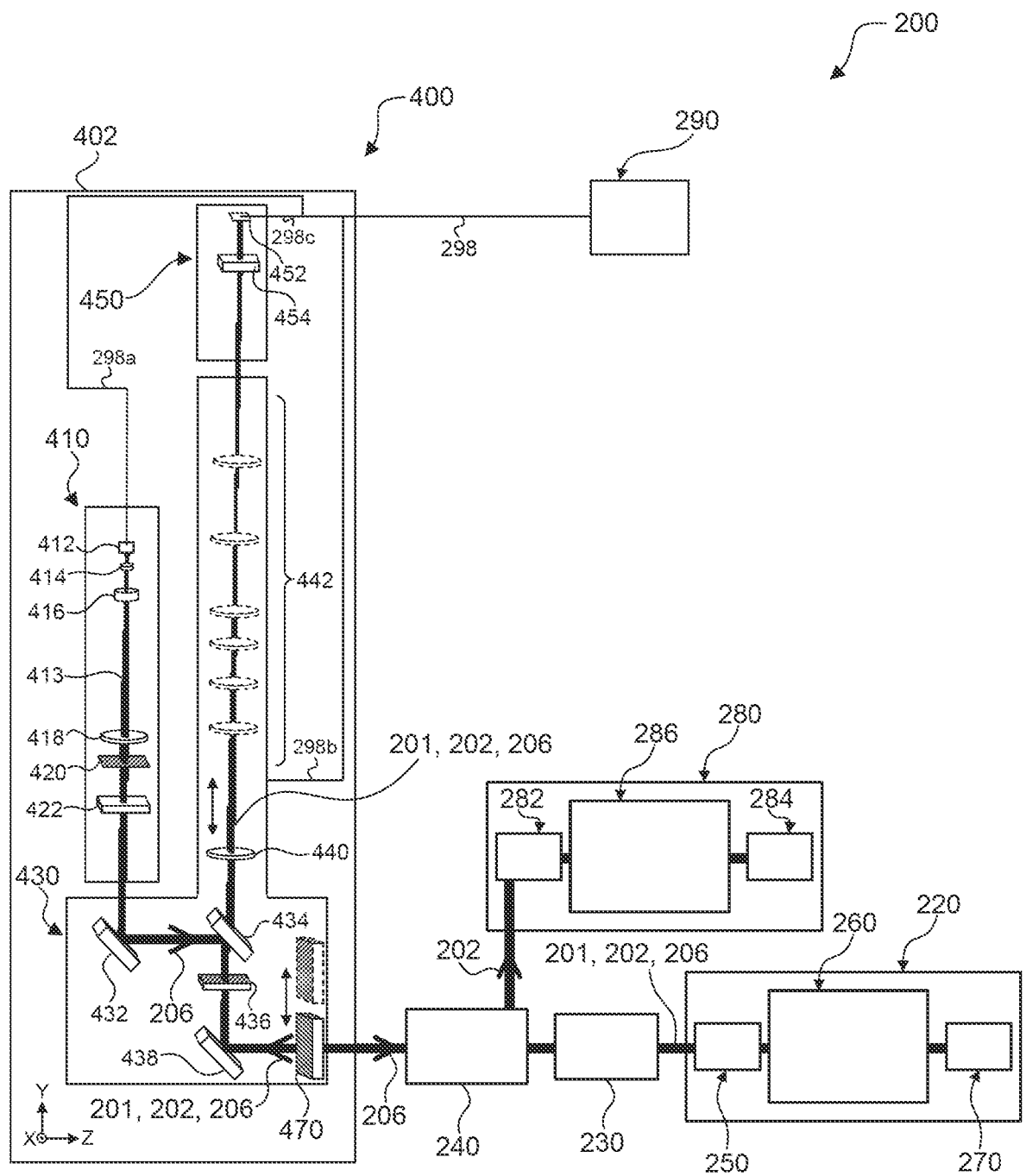
FIG. 5 is a schematic partial illustration of the light source apparatus shown in FIG. 2, according to an exemplary embodiment.

FIGS. 2-5 illustrate light source apparatus 200, according to various exemplary embodiments. FIG. 2 is a schematic top plan illustration of light source apparatus 200, according to an exemplary embodiment. FIGS. 3 and 4 are schematic partial cross-sectional illustrations of gas discharge stage 220 of light source apparatus 200 shown in FIG. 2, according to exemplary embodiments. FIG. 5 is a schematic partial illustration of light source apparatus 200 shown in FIG. 2, according to an exemplary embodiment.

FIG. 2 illustrates light source apparatus 200, according to various exemplary embodiments. Light source apparatus 200 can be configured to monitor and dynamically control quantifiable alignment errors of gas discharge stage 220 (e.g., MO) and provide a highly coherent and aligned light beam (e.g., light beam 202, amplified light beam 204), for example, to a DUV lithographic apparatus (e.g., LA). Light source apparatus 200 can be further configured to reduce alignment times of gas discharge stage 220 (e.g., MO) and reduce alignment variations of gas discharge stage 220 (e.g., MO) over time. Although light source apparatus 200 is shown in FIG. 2 as a stand-alone apparatus and/or system, the embodiments of this disclosure can be used with other optical systems, such as, but not limited to, radiation source SO, lithographic apparatus LA, and/or other optical systems. In some embodiments, light source apparatus 200 can be radiation source SO in lithographic apparatus LA. For example, EUV and/or DUV radiation beam B can be light beam 202 and/or amplified light beam 204.

Light source apparatus 200 can be a MOPA formed by gas discharge stage 220 (e.g., MO) and power ring amplifier (PRA) stage 280 (e.g., PA). Light source apparatus 200 can include gas discharge stage 220, line analysis module (LAM) 230, master oscillator wavefront engineering box (MoWEB) 240, power ring amplifier (PRA) stage 280, controller 290, and imaging apparatus 400 (e.g., MO cavity alignment tool (MoCAT)). In some embodiments, all of the above listed components can be housed in a three-dimensional (3D) frame 210. For example, imaging apparatus 400 can be integrated within 3D frame 210 that also houses gas discharge stage 220. In some embodiments, 3D frame 210 can include a metal (e.g., aluminum, steel, etc.), a ceramic, and/or any other suitable rigid material.

Gas discharge stage 220 can be configured to output a highly coherent light beam (e.g., light beam 202). Gas discharge stage 220 can include first optical resonator element 254, second optical resonator element 224, input/output optical element 250 (e.g., OC), optical amplifier 260, and spectral feature adjuster 270 (e.g., LNM). In some embodiments, input/output optical element 250 can include first optical resonator element 254 and spectral feature adjuster 270 can include second optical resonator element 224. First optical resonator 228 can be defined by input/output optical element 250 (e.g., via first optical resonator element 254) and spectral feature adjuster 270 (e.g., via second optical resonator element 224). First optical resonator element 254 can be partially reflective (e.g., partial mirror) and second optical resonator element 224 can be reflective (e.g., mirror or grating) to form first optical resonator 228. First optical resonator 228 can direct light generated by optical amplifier 260 (e.g., amplified spontaneous emission (ASE) 201) into optical amplifier 260 for a fixed number of passes to form light beam 202. In some embodiments, as shown in FIG. 2, gas discharge stage 220 can output light beam 202 to PRA stage 280 as part of a MOPA arrangement.

PRA stage 280 can be configured to amplify light beam 202 from gas discharge stage 220 through a multi-pass arrangement and output amplified light beam 204. PRA stage 280 can include third optical resonator element 282, power ring amplifier (PRA) 286, and fourth optical resonator element 284. Second optical resonator 288 can be defined by third optical resonator element 282 and fourth optical resonator element 284. Third optical resonator element 282 can be partially reflective (e.g., partial beamsplitter) and fourth optical resonator element 284 can be reflective (e.g., mirror or prism or beam reverser) to form second optical resonator 288. Second optical resonator 288 can direct light beam 202 from gas discharge stage 220 into PRA 286 for a fixed number of passes to form amplified light beam 204. In some embodiments, PRA stage 280 can output amplified light beam 204 to a lithographic apparatus, for example, lithographic apparatus (LA). For example, amplified light beam 204 can be EUV and/or DUV radiation beam B from radiation source SO in lithographic apparatus LA.

As shown in FIGS. 2-4, optical amplifier 260 can be optically coupled to input/output optical element 250 and spectral feature adjuster 270. Optical amplifier 260 can be configured to output ASE 201 and/or light beam 202. In some embodiments, optical amplifier 260 can utilize ASE 201 as a beacon to guide boresighting of an optical axis of chamber 261 and/or an optical axis of gas discharge stage 220 (e.g., MO cavity). Optical amplifier 260 can include chamber 261, gas discharge medium 263, and chamber adjuster 265. Gas discharge medium 263 can be disposed within chamber 261, and chamber 261 can be disposed on chamber adjuster 265.

Chamber 261 can be configured to hold gas discharge medium 263 within first and second chamber optical ports 262a, 262b Chamber 261 can include first chamber optical port 262a and second chamber optical port 262b opposite first chamber optical port 262a. In some embodiments, first and second chamber optical ports 262a, 262b can form an optical axis of chamber 261.

As shown in FIG. 3, first chamber optical port 262a can be in optical communication with input/output optical element 250. First chamber optical port 262a can include first chamber wall 261a, first chamber window 266a, and first chamber aperture 264a. In some embodiments, as shown in FIG. 3, first chamber aperture 264a can be a rectangular opening.

As shown in FIG. 4, second chamber optical port 262b can be in optical communication with spectral feature adjuster 270. Second chamber optical port 262b can include second chamber wall 261b, second chamber window 266b, and second chamber aperture 264b. In some embodiments, as shown in FIG. 4, second chamber aperture 264b can be a rectangular opening. In some embodiments, the optical axis of chamber 261 passes through first and second chamber apertures 264a, 264b.

Gas discharge medium 263 can be configured to output ASE 201 (e.g., 193 nm) and/or light beam 202 (e.g., 193 nm). In some embodiments, gas discharge medium 263 can include a gas for excimer lasing (e.g., $Ar_2$, $Kr_2$, $F_2$, $Xe_2$, ArF, KrCl, KrF, XeBr, XeCl, XeF, etc.). For example, gas discharge medium 263 can include ArF and, upon excitation (e.g., applied voltage) from surrounding electrodes (not shown) in chamber 261, output ASE 201 (e.g., 193 nm) and/or light beam 202 (e.g., 193 nm) through first and second chamber optical ports 262a, 262b. In some embodiments, gas discharge stage 220 can include a voltage power supply (not shown) configured to apply high voltage electrical pulses across electrodes (not shown) in chamber 261.

Chamber adjuster 265 can be configured to spatially adjust (e.g., laterally, angularly, etc.) an optical axis of chamber 261 (e.g., along first and second chamber optical ports 262a, 262b). As shown in FIG. 2, chamber adjuster 265 can be coupled to chamber 261 and first and second chamber optical ports 262a, 262b. In some embodiments, chamber adjuster 265 can have six degrees of freedom (e.g., 6-axis). For example, chamber adjuster 265 can include one or more linear motor(s) and/or actuator(s) providing adjustment of the optical axis of chamber 261 in six degrees of freedom (e.g., forward/back, up/down, left/right, yaw, pitch, roll). In some embodiments, chamber adjuster 265 can adjust chamber 261 laterally and angularly to align the optical axis of chamber 261 (e.g., along first and second chamber optical ports 262a, 262b) with an optical axis of gas discharge stage 220 (e.g., MO cavity).

For example, as shown in FIG. 2, the optical axis of gas discharge stage 220 (e.g., MO cavity) can be defined by the optical axis of chamber 261 (e.g., along first and second chamber optical ports 262a, 262b), input/output optical element 250 (e.g., OC aperture 252), and spectral feature adjuster 270 (e.g., LNM aperture 272).

Input/output optical element 250 (e.g., OC) can be configured to be in optical communication with first chamber optical port 262a. In some embodiments, input/output optical element 250 can be an optical coupler (OC) configured to partially reflect a light beam and form first optical resonator 228. For example, OCs have been previously described in U.S. Pat. No. 7,885,309, issued Feb. 8, 2011, which is hereby incorporated by reference in its entirety. As shown in FIG. 2, input/output optical element 250 can include first optical resonator element 254 to direct (e.g., reflect) light into optical amplifier 260 and to transmit light (e.g., light beam 202, ASE 201) from optical amplifier 260 out of gas discharge stage 220 (e.g., MO cavity).

As shown in FIG. 3, input/output optical element 250 can include OC aperture 252 and first optical resonator element 254. First optical resonator element 254 can be configured to angularly adjust (e.g., tip and/or tilt) light through OC aperture 252 in vertical and/or horizontal directions relative to chamber 261 (e.g., first chamber optical port 262a). In some embodiments, OC aperture 252 can be a rectangular opening. In some embodiments, alignment of gas discharge stage 220 can be based on alignment of first chamber aperture 264a and OC aperture 252. In some embodiments, first optical resonator element 254 can adjust input/output optical element 250 angularly (e.g., tip and/or tilt) such that reflections from input/output optical element 250 are parallel to the optical axis of gas discharge stage 220 (e.g., MO cavity). In some embodiments, first optical resonator element 254 can be an adjustable mirror (e.g., partial reflector, beamsplitter, etc.) capable of angular adjustment (e.g., tip and/or tilt). In some embodiments, OC aperture 252 can be fixed and first optical resonator element 254 can be adjusted. In some embodiments, OC aperture 252 can be adjusted. For example, OC aperture 252 can be spatially adjusted in vertical and/or horizontal directions relative to chamber 261.

Spectral feature adjuster 270 (e.g., LNM) can be configured to be in optical communication with second chamber optical port 262b. In some embodiments, spectral feature adjuster 270 can be a line narrowing module (LNM) configured to provide spectral line narrowing to a light beam. For example, LNMs have been previously described in U.S. Pat. No. 8,126,027, issued Feb. 28, 2012, which is hereby incorporated by reference in its entirety.

As shown in FIG. 2, spectral feature adjuster 270 can include second optical resonator element 224 to direct (e.g., reflect) light (e.g., light beam 202, ASE 201) from optical amplifier 260 back into optical amplifier 260 toward input/output optical element 250.

As shown in FIG. 4, spectral feature adjuster 270 can include LNM aperture 272 and tilt angular modulator (TAM) 274. TAM 274 can be configured to angularly adjust light through LNM aperture 272 in vertical and/or horizontal directions relative to chamber 261 (e.g., second chamber optical port 262b). In some embodiments, LNM aperture 272 can be a rectangular opening. In some embodiments, alignment of gas discharge stage 220 can be based on alignment of second chamber aperture 264b and LNM aperture 272. In some embodiments, TAM 274 can adjust spectral feature adjuster 270 angularly (e.g., tip and/or tilt) such that reflections from spectral feature adjuster 270 are parallel to the optical axis of gas discharge stage 220 (e.g., MO cavity). In some embodiments, TAM 274 can include adjustable mirrors (e.g., partial reflector, beamsplitter, etc.) and/or adjustable prisms capable of angular adjustment (e.g., tip and/or tilt). In some embodiments, LNM aperture 272 can be fixed and TAM 274 can be adjusted. In some embodiments, LNM aperture 272 can be adjusted. For example, LNM aperture 272 can be spatially adjusted in vertical and/or horizontal directions relative to chamber 261.

LAM 230 can be configured to monitor a line center (e.g., center wavelength) of a light beam (e.g., light beam 202, imaging light 206). LAM 230 can be further configured to monitor an energy of a light beam (e.g., ASE 201, light beam 202, imaging light 206) for metrology wavelength measurements. For example, LAMs have been previously described in U.S. Pat. No. 7,885,309, issued Feb. 8, 2011, which is hereby incorporated by reference in its entirety.

As shown in FIG. 2, LAM 230 can be optically coupled to gas discharge stage 220 and/or MoWEB 240. In some embodiments, LAM 230 can be disposed between gas discharge stage 220 and MoWEB 240. For example, as shown in FIG. 2, LAM 230 can be optically coupled directly to MoWEB 240 and optically coupled to gas discharge stage 220.

In some embodiments, as shown in FIG. 2, beamsplitter 212 can be configured to direct ASE 201 and/or light beam 202 toward PRA stage 280, and direct ASE 201 and/or light beam 202 toward imaging apparatus 400. In some embodiments, as shown in FIG. 2, beamsplitter 212 can be configured to direct imaging light 206 from imaging apparatus 400 toward gas discharge stage 220. In some embodiments, as shown in FIG. 2, beamsplitter 212 can be disposed in MoWEB 240.

MoWEB 240 can be configured to provide beam shaping to a light beam (e.g., light beam 202, imaging light 206). MoWEB 240 can be further configured to monitor forward and/or backward propagation of a light beam (e.g., ASE 201, light beam 202, imaging light 206). For example, MoWEBs have been previously described in U.S. Pat. No. 7,885,309, issued Feb. 8, 2011, which is hereby incorporated by reference in its entirety. As shown in FIGS. 2 and 4, MoWEB 240 can be optically coupled to LAM 230 and/or imaging apparatus 400. In some embodiments, MoWEB 240 can be disposed between LAM 230 and imaging apparatus 400. For example, as shown in FIG. 2, MoWEB 240 can be optically coupled directly to LAM 230 and optically coupled directly to imaging apparatus 400. In some embodiments, LAM 230, MoWEB 240, and/or imaging apparatus can be optically coupled to gas discharge stage 220 via a single optical arrangement.

Controller 290 can be configured to be in communication with input/output optical element 250, chamber adjuster 265, spectral feature adjuster 270, and/or imaging apparatus 400. In some embodiments, controller 290 can be configured to provide first signal 292 to input/output optical element 250, second signal 294 to spectral feature adjuster 270, third signal 296 to chamber adjuster 265, and fourth signal 298 to imaging apparatus 400. For example, as shown in FIG. 5, fourth signal 298 can include first sub-signal 298a to illuminator 410, second sub-signal 298b to optical arrangement 430, and third sub-signal 298c to sensing apparatus 450 of imaging apparatus 400. In some embodiments, controller 290 can be configured to provide a signal (e.g., first signal 292 and/or second signal 294) to input/output optical element 250 and/or spectral feature adjuster 270 and adjust input/output optical element 250 (e.g., adjust first optical resonator element 254) and/or spectral feature adjuster 270 (e.g., adjust TAM 274) based on an output (e.g., two-dimensional (2D) image comparison) from imaging apparatus 400. For example, the output can be from sensing apparatus 450 along third sub-signal 298c.

In some embodiments, first optical resonator element 254, chamber adjuster 265, and/or TAM 274 can be in physical and/or electronic communication with controller 290 (e.g., first signal 292, second signal 294, and/or third signal 296). For example, first optical resonator element 254, chamber adjuster 265, and/or TAM 274 can be adjusted (e.g., laterally and/or angularly) by controller 290 to align the optical axis of chamber 261 (e.g., along first and second chamber optical ports 262a, 262b) with the optical axis of gas discharge stage 220 (e.g., MO cavity) defined by input/output optical element 250 (e.g., OC aperture 252) and spectral feature adjuster 270 (e.g., LNM aperture 272).

Exemplary Imaging Apparatus

Figure 6:
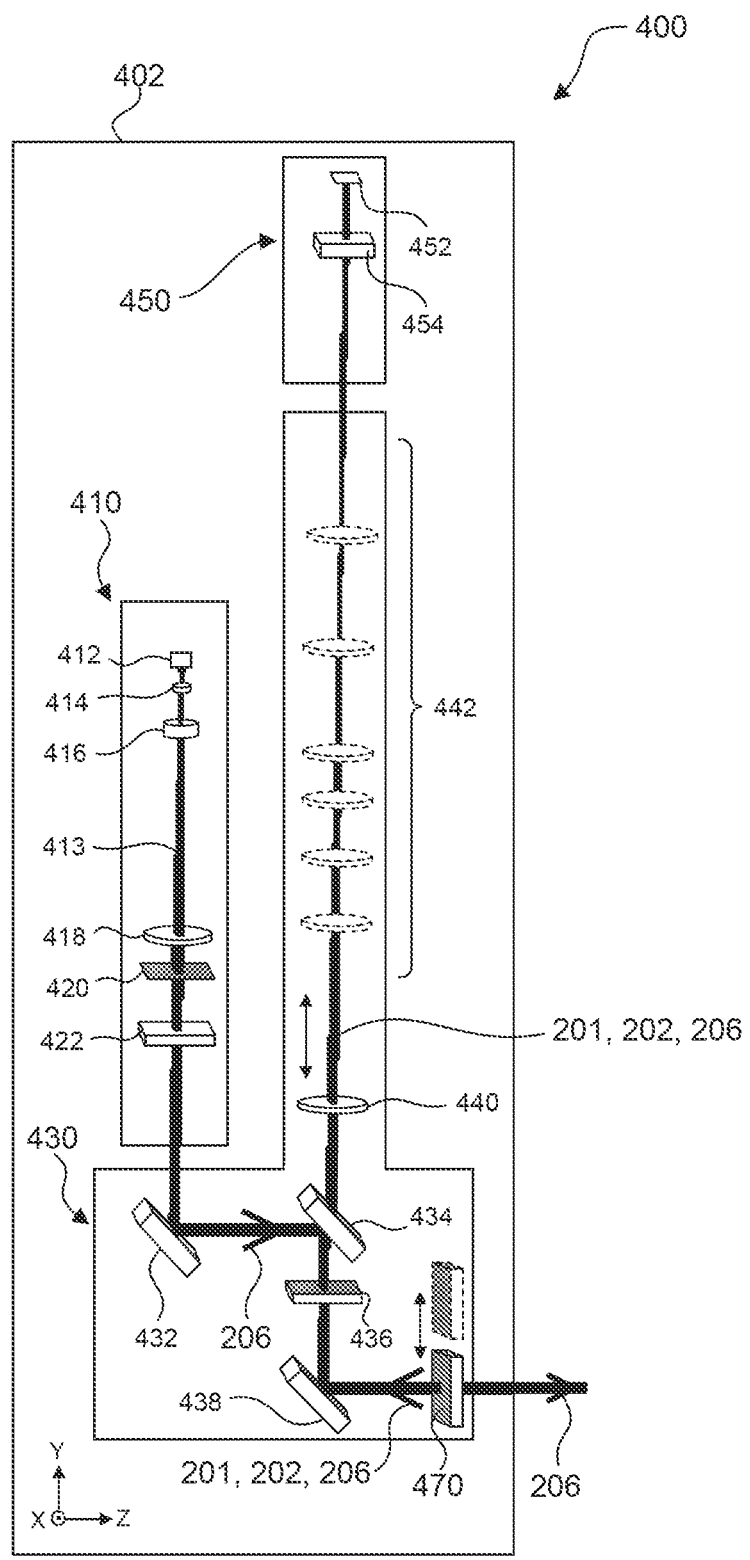
FIG. 6 is a schematic illustration of an imaging apparatus, according to an exemplary embodiment.

FIGS. 5 and 6 illustrate imaging apparatus 400, according to various exemplary embodiments. FIG. 5 is a schematic partial illustration of light source apparatus 200 shown in FIG. 2 with imaging apparatus 400, according to an exemplary embodiment. FIG. 6 is an illustration of imaging apparatus 400, according to an exemplary embodiment.

Imaging apparatus 400 can be configured to monitor and measure quantifiable alignment errors of gas discharge stage 220. Imaging apparatus 400 can be further configured to reduce alignment times of gas discharge stage 220 and reduce alignment variations of gas discharge stage 220 over time. Although imaging apparatus 400 is shown in FIGS. 5 and 6 as a stand-alone apparatus and/or system, the embodiments of this disclosure can be used with other optical systems, such as, but not limited to, radiation source SO, lithographic apparatus LA, light source apparatus 200, and/or other optical systems. In some embodiments, imaging apparatus 400 can be external to 3D frame 210 of light source apparatus 200. For example, imaging apparatus 400 can be part of a separate external alignment and/or metrology tool.

Imaging apparatus 400 can be a MO cavity alignment tool (MoCAT) for gas discharge stage 220 (e.g., MO) of light source apparatus 200. Imaging apparatus 400 can include illuminator 410, optical arrangement 430, and sensing apparatus 450. In some embodiments, as shown in FIGS. 5 and 6, all of the above listed components can be housed in a three-dimensional (3D) frame 402. For example, 3D frame 402 can be 55 cm (length)×25 cm (width)×10 cm (depth). In some embodiments, 3D frame 402 can include a metal (e.g., aluminum, steel, etc.), a ceramic, and/or any other suitable rigid material.

Illuminator 410 can be configured to direct imaging light 206 into gas discharge stage 220. Illuminator 410 can include illumination source 412, illumination 413, first optical element 414, second optical element 416, third optical element 418, beam shaping aperture 420, and/or half-wave plate 422. In some embodiments, illumination source 412 can include a laser diode or light emitting diode (LED) outputting illumination 413. For example, illumination 413 can have a wavelength of about 400 nm to about 700 nm, for example, 405 nm. In some embodiments, as shown in FIGS. 5 and 6, first optical element 414 can include collimating and/or condensing optics (e.g., collimator, condenser, etc.) and second and third optical elements 416, 418 can include beam shaping optics (e.g., beam expander, telescope, etc.). In some embodiments, beam shaping aperture 420 and/or first polarizing optic 422 (e.g., half-wave plate) can be configured to condition (e.g., define beam diameter, define polarization of beam, etc.) illumination 413 to form imaging light 206. As shown in FIGS. 5 and 6, illuminator 410 can be optically coupled to optical arrangement 430 and direct imaging light 206 toward optical arrangement 430. In some embodiments, illuminator 410 can direct a single optical pulse toward gas discharge stage 220. For example, as shown in FIG. 5, controller 290 can send a trigger via first sub-signal 298a to illumination source 412.

Optical arrangement 430 can be configured to image light (e.g., imaging light 206, ASE 201, and/or light beam 202) from a plurality of distinct imaging lens position(s) 442, for imaging different object planes within gas discharge stage 220, onto sensing apparatus 450. Optical arrangement 430 can include first beam steering optic 432 (e.g., adjustable mirror), first beamsplitter 434 (e.g., polarizing beamsplitter), second polarizing optic 436 (e.g., quarter-wave plate), second beam steering optic 438 (e.g., adjustable mirror), imaging lens 440, imaging lens position(s) 442 for imaging different object planes in gas discharge stage 220, and retractable retroreflector 470. First beam steering optic 432 can be configured to receive imaging light 206 from illuminator 410 and adjust (e.g., translate) along the optical axis of imaging light 206 (e.g., Y-axis direction). First beamsplitter 434 can be configured to reflect imaging light 206 from first beam steering optic 432 and transmit imaging light 206, ASE 201, and/or light beam 202 from gas discharge stage 220 (e.g., from object planes at OC aperture 252, first chamber aperture 264a, second chamber aperture 264b, and/or LNM aperture 272) toward sensing apparatus 450. Second beam steering optic 438 can be configured to adjust (e.g., tilt and/or rotate) reflected imaging light 206, ASE 201, and/or light beam 202. In some embodiments, first and second beam steering optics 432, 438 can each include a linear motor and/or actuator providing adjustment (e.g., translation, tilt, rotation, etc.) and can be adjusted simultaneously to direct imaging light 206 toward gas discharge stage 220. For example, as shown in FIG. 5, controller 290 can send a signal via second sub-signal 298b to optical arrangement 430 to adjust first and second beam steering optics 432, 438. In some embodiments, optical arrangement 430 can include one or more zoom lenses.

Imaging lens 440 can include a linear motor and/or actuator providing adjustment (e.g., translation) of imaging lens 440 along the optical axis of imaging light 206, ASE 201, and/or light beam 202 (e.g., Y-axis direction) toward sensing apparatus 450. In some embodiments, as shown in FIGS. 5 and 6, imaging lens 440 can be adjusted along an optical path of imaging light 206 and/or light beam 202 and/or ASE 201 to imaging lens position 442 to thereby select which object plane is imaged onto sensing apparatus 450. For example, imaging lens position(s) 442, for imaging different object planes in gas discharge stage 220, can image object planes of OC aperture 252, first chamber aperture 264*a*, second chamber aperture 264*b*, and/or LNM aperture 272. Retractable retroreflector 470 can be configured to reflect imaging light 206 back to its source (e.g., first beamsplitter 434) with minimal scattering (e.g., wavefront is reflected straight back). In some embodiments, retractable retroreflector 470 can include a corner reflector (e.g., Au corner cube reflector), a cat eye reflector, or a phase-conjugate mirror. In some embodiments, first and second beam steering optics 432, 438 can be adjusted to direct imaging light 206 along the optical axis of gas discharge stage 220 (e.g., MO cavity), prior to inserting retractable retroreflector 470 into imaging light 206, to define a reference alignment position (e.g., reference alignment position for OC aperture 252 alignment). In some embodiments, retractable retroreflector 470 can be inserted into imaging light 206 to focus reflected imaging light 206 onto sensing apparatus 450 to define a first alignment position.

Sensing apparatus 450 can be configured to receive imaging light 206, ASE 201, and/or light beam 202 based on a position of imaging lens 440 at imaging lens position(s) 442 (e.g., that corresponds to object planes at OC aperture 252, first chamber aperture 264*a*, second chamber aperture 264*b*, and/or LNM aperture 272). Sensing apparatus 450 can include camera 452 and camera neutral density (ND) filter 454. In some embodiments, camera ND filter 454 can include one or more wavelength filter(s). In some embodiments, camera 452 can sense a two-dimensional (2D) representation of imaging light 206, ASE 201, and/or light beam 202. In some embodiments, camera 452 can include a charged coupled device (CCD) or a complementary metal-oxide-semiconductor (CMOS) camera. For example, camera 452 can include a back-thinned CCD camera and/or a back-thinned CMOS camera. In some embodiments, sensing apparatus 450 can monitor and/or measure a 2D beam profile of imaging light 206, ASE 201, and/or light beam 202. For example, as shown in FIG. 5, controller 290 can receive a detected image from sensing apparatus 450 via third sub-signal 298*c*.

In some embodiments, optical arrangement 430 and sensing apparatus 450 can be configured to receive ASE 201 from gas discharge stage 220 for an initial calibration. For example, ASE 201 can be used as a beacon to guide boresighting imaging light 206 with an optical axis of chamber 261 and adjust (e.g., coarse) chamber 261 (e.g., via chamber adjuster 265) along an optical axis of imaging light 206. In some embodiments, both imaging light 206 from imaging apparatus 400 and ASE 201 from chamber 261 can be aligned along OC aperture 252 and LNM aperture 272. For example, imaging light 206 can be adjusted via optical arrangement 430 in order to center imaging light 206 on OC aperture 252 and/or LNM aperture 272.

In some embodiments, input/output optical element 250 (e.g., OC) can be aligned with imaging light 206. For example, optical arrangement 430 can be adjusted in order to focus imaging light 206 onto input/output optical element 250 (e.g., onto OC aperture 252). In some embodiments, retractable retroreflector 470 can be inserted into imaging light 206 to define a first alignment position (e.g., X-Y digital image position). In some embodiments, retractable retroreflector 470 can be removed from imaging light 206 and input/output optical element 250 can be adjusted in order to focus imaging light 206 onto sensing apparatus 450 from a second alignment position (e.g., X-Y digital image position) to a first alignment position (e.g., X-Y digital image position). For example, a far-field (FF) back reflection of imaging light 206 from input/output optical element 250 (e.g., OC) can be imaged onto sensing apparatus 450 and adjusted (e.g., via first optical resonator element 254) until (e.g., iteratively) first and second alignment positions coincide (e.g., same X-Y digital image position).

In some embodiments, spectral feature adjuster 270 (e.g., LNM) and chamber 261 can be aligned with light beam 202 and/or ASE 201. For example, a beam profile of light beam 202 at OC aperture 252 and/or LNM aperture 272 can be focused onto sensing apparatus 450. In some embodiments, vertical symmetry of light beam 202 at OC aperture 252 can be measured with sensing apparatus 450 and spectral feature adjuster 270 (e.g., LNM) can be adjusted by TAM 274 to align light beam 202 reflected from spectral feature adjuster 270 (e.g., LNM) with the optical axis of gas discharge stage 220 (e.g., MO cavity). For example, a near-field (NF) beam profile of light beam 202 at OC aperture 252 can be imaged by sensing apparatus 450. In some embodiments, horizontal symmetry of light beam 202 at OC aperture 252 can be measured with sensing apparatus 450 and chamber 261 can be adjusted by chamber adjuster 265 to align light beam 202 with OC aperture 252. For example, a near-field (NF) beam profile of light beam 202 at OC aperture 252 can be imaged by sensing apparatus 450. In some embodiments, horizontal symmetry of light beam 202 at LNM aperture 272 can be measured with sensing apparatus 450 and chamber 261 can be adjusted by chamber adjuster 265 to align light beam 202 with LNM aperture 272. For example, a near-field (NF) beam profile of light beam 202 at LNM aperture 272 can be imaged by sensing apparatus 450. In some embodiments, alignment of spectral feature adjuster 270 (e.g., LNM) and chamber 261 with light beam 202 can occur simultaneously with light beam 202 being utilized in a lithographic apparatus. For example, alignment can occur simultaneously with light beam 202 and/or amplified light beam 204 being utilized in radiation source SO of lithographic apparatus LA.

Additional Exemplary Imaging Apparatuses

Figure 7:
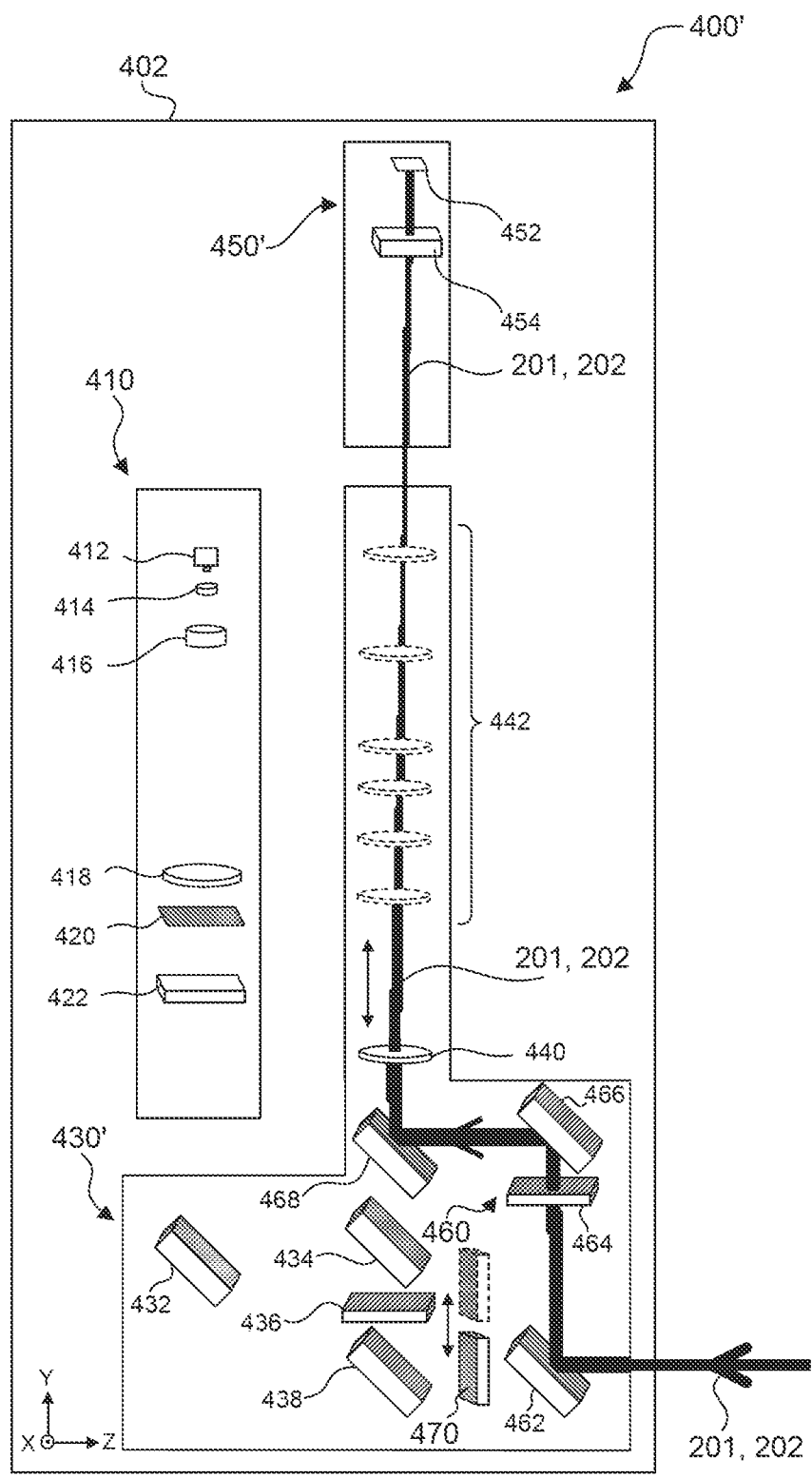
FIG. 7 is a schematic illustration of an imaging apparatus, according to an exemplary embodiment.
Figure 8:
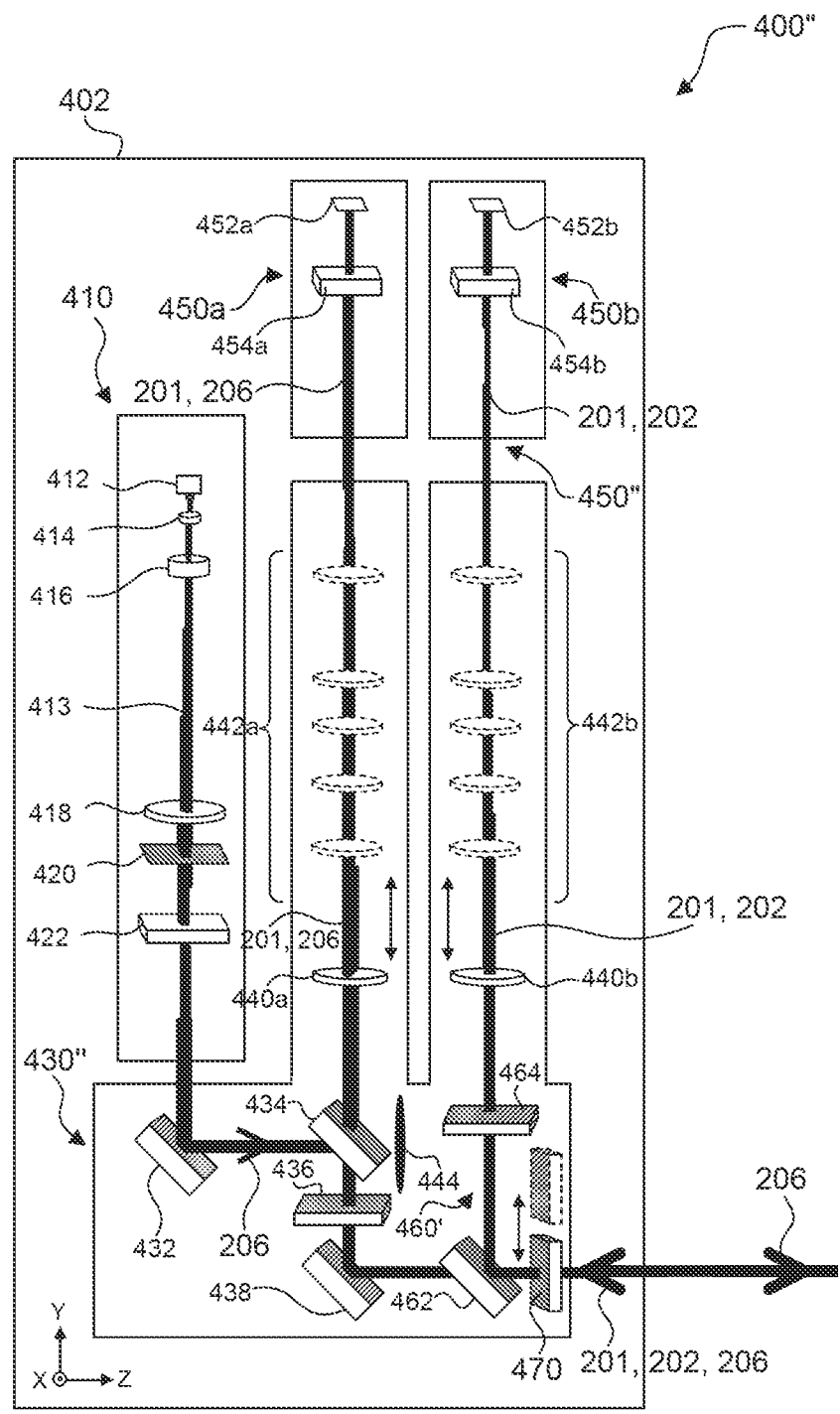
FIG. 8 is a schematic illustration of an imaging apparatus, according to an exemplary embodiment.

FIGS. 7 and 8 illustrate imaging apparatuses 400', 400'', according to various exemplary embodiments. FIG. 7 illustrates imaging apparatus 400' with optical arrangement 430' with light beam optical branch 460 configured to receive and transmit light beam 202 and/or ASE 201 toward sensing apparatus 450'. FIG. 8 illustrates imaging apparatus 400'' with optical arrangement 430'' with light beam optical branch 460' and sensing apparatus 450'' with first sensing apparatus 450*a* configured to receive imaging light 206 and/or ASE 201 and second sensing apparatus 450*b* configured to receive light beam 202 and/or ASE 201. In some embodiments, first and second sensing apparatuses 450*a*, 450*b* can be combined into a single sensing apparatus (e.g., single camera).

FIG. 7 illustrates imaging apparatus 400', according to an exemplary embodiment. The embodiments of imaging apparatus 400 shown in FIGS. 5 and 6 and the embodiments of imaging apparatus 400' shown in FIG. 7 may be similar. Similar reference numbers are used to indicate similar features of the embodiments of imaging apparatus 400 shown in FIGS. 5 and 6 and the similar features of the embodiments of imaging apparatus 400' shown in FIG. 7.

The main difference between the embodiments of imaging apparatus 400 shown in FIGS. 5 and 6 and the embodiments of imaging apparatus 400' shown in FIG. 7 is that imaging apparatus 400' includes optical arrangement 430' with light beam optical branch 460 configured to receive and transmit light beam 202 toward sensing apparatus 450' rather than optical arrangement 430 and sensing apparatus 450 shown in FIGS. 5 and 6.

Although imaging apparatus 400' is shown in FIG. 7 as a stand-alone apparatus and/or system, the embodiments of this disclosure can be used with other optical systems, such as, but not limited to, radiation source SO, lithographic apparatus LA, light source apparatus 200, imaging apparatus 400, and/or other optical systems. In some embodiments, imaging apparatus 400' can be external to 3D frame 210 of light source apparatus 200. For example, imaging apparatus 400' can be part of a separate external alignment and/or metrology tool.

As shown in FIG. 7, an exemplary aspect of imaging apparatus 400' is optical arrangement 430' with light beam optical branch 460 configured to receive light beam 202 and/or ASE 201. In some embodiments, light beam optical branch 460 can isolate light beam 202 and/or ASE 201 and direct light beam 202 and/or ASE 201 toward sensing apparatus 450' separate from imaging light 206. For example, as shown in FIG. 7, light beam optical branch 460 can include coated optical elements configured to reflect a specific wavelength of light beam 202 and/or ASE 201, for example, 193 nm (e.g., for gas discharge medium 263 of ArF).

Light beam optical branch 460 can include first DUV dielectric mirror 462, DUV neutral density (ND) filter 464, first DUV mirror 466, and second DUV dielectric mirror 468. First DUV dielectric mirror 462 can be configured to receive light beam 202 and/or ASE 201 from gas discharge stage 220 and reflect light beam 202 (e.g., 193 nm) and/or ASE 201 and transmit imaging light 206 (e.g., 405 nm) and/or ASE 201. First DUV dielectric mirror 462 can reflect light beam 202 and/or ASE 201 toward DUV ND filter 464 and first DUV mirror 466. First DUV mirror 466 can be configured to reflect light beam 202 (e.g., 193 nm) and can include a UV fused silica or BK7 window. In some embodiments, first DUV mirror 466 can be a window (e.g., UV fused silica or BK7 window) configured to reflect light beam 202 (e.g., 193 nm) and reduce the intensity of light beam 202 (e.g., reduce by a factor of 100:1).

Second DUV dielectric mirror 468 can be configured to reflect light beam 202 and/or ASE 201 toward sensing apparatus 450' and transmit imaging light 206 (e.g., 405 nm). As shown in FIG. 7, imaging light 206 from illuminator 410 in optical arrangement 430' is omitted for clarity. Sensing apparatus 450' is configured to receive only light beam 202 and/or ASE 201 for a particular measurement (e.g., beam profiling). In some embodiments, similar to first and second beam steering optics 432, 438 of optical arrangement 430, first and second DUV dielectric mirrors 462, 468, and/or first DUV mirror 466 can each include a linear motor and/or actuator providing adjustment (e.g., translation, tilt, rotation, etc.) and can be adjusted simultaneously to direct light beam 202 and/or ASE 201 toward sensing apparatus 450'.

FIG. 8 illustrates imaging apparatus 400", according to an exemplary embodiment. The embodiments of imaging apparatus 400' shown in FIG. 7 and the embodiments of imaging apparatus 400" shown in FIG. 8 may be similar. Similar reference numbers are used to indicate similar features of the embodiments of imaging apparatus 400' shown in FIG. 7 and the similar features of the embodiments of imaging apparatus 400" shown in FIG. 8. The main differences between the embodiments of imaging apparatus 400' shown in FIG. 7 and the embodiments of imaging apparatus 400" shown in FIG. 8 is that imaging apparatus 400" includes optical arrangement 430" with light beam optical branch 460' configured to receive and transmit light beam 202 toward sensing apparatus 450" rather than optical arrangement 430' shown in FIG. 7, and imaging apparatus 400" includes sensing apparatus 450" with first sensing apparatus 450a configured to receive imaging light 206 and/or ASE 201 and second sensing apparatus 450b configured to receive light beam 202 and/or ASE 201 rather than sensing apparatus 450' shown in FIG. 7. In some embodiments, first and second sensing apparatuses 450a, 450b can be combined into a single sensing apparatus (e.g., single camera).

In some embodiments, first and second sensing apparatuses 450a, 450b can be two separate independent sensing apparatuses, each with an independent camera.

Although imaging apparatus 400" is shown in FIG. 8 as a stand-alone apparatus and/or system, the embodiments of this disclosure can be used with other optical systems, such as, but not limited to, radiation source SO, lithographic apparatus LA, light source apparatus 200, imaging apparatus 400, imaging apparatus 400', and/or other optical systems. In some embodiments, imaging apparatus 400" can be external to 3D frame 210 of light source apparatus 200. For example, imaging apparatus 400" can be part of a separate external alignment and/or metrology tool.

As shown in FIG. 8, an exemplary aspect of imaging apparatus 400" is optical arrangement 430" with first imaging lens 440a configured to receive imaging light 206 and/or ASE 201 and second imaging lens 440b and light beam optical branch 460' configured to receive light beam 202 and/or ASE 201. In some embodiments, light beam optical branch 460' can isolate light beam 202 and/or ASE 201 and direct light beam 202 and/or ASE 201 toward sensing apparatus 450" separate from imaging light 206. For example, as shown in FIG. 8, light beam optical branch 460' can include coated optical elements configured to reflect a specific wavelength of light beam 202 and/or ASE 201, for example, 193 nm (e.g., for gas discharge medium 263 of ArF).

Optical arrangement 430" can include first imaging lens 440a, first imaging lens position(s) 442a, beam block 444, second imaging lens 440b, second imaging lens position(s) 442b, and light beam optical branch 460'. First and second imaging lenses 440a, 440b, similar to imaging lens 440, can each include a linear motor and/or actuator providing adjustment (e.g., translation) of first and second imaging lenses 440a, 440b along the optical axis of imaging light 206 and/or ASE 201 (e.g., Y-axis direction) and light beam 202 and/or ASE 201 (e.g., Y-axis direction), respectively, toward sensing apparatus 450". In some embodiments, as shown in FIG. 8, first imaging lens 440a can be adjusted along an optical path of imaging light 206 and/or ASE 201 to imaging lens position 442a to thereby select which object plane is imaged onto first sensing apparatus 450a. For example, imaging lens position(s) 442a, for imaging different object planes in gas discharge stage 220, can image object planes of OC aperture 252, first chamber aperture 264a, second chamber aperture 264b, and/or LNM aperture 272. In some embodiments, as shown in FIG. 8, second imaging lens 440b can be adjusted along an optical path of light beam 202 and/or ASE 201 to imaging lens position 442b to thereby select which object plane is imaged onto second sensing apparatus 450b. For example, imaging lens position(s) 442b, for imaging different object planes in gas discharge stage 220, can image object planes of OC aperture 252, first chamber aperture 264a, second chamber aperture 264b, and/or LNM aperture 272.

Light beam optical branch 460' can include first DUV dielectric mirror 462 and DUV neutral density (ND) filter 464. First DUV dielectric mirror 462 can be configured to receive light beam 202 and/or ASE 201 from gas discharge stage 220 and reflect light beam 202 (e.g., 193 nm) and/or ASE 201 and transmit imaging light 206 (e.g., 405 nm) and/or ASE 201. First DUV dielectric mirror 462 can reflect light beam 202 and/or ASE 201 toward DUV ND filter 464 and second imaging lens 440b. Second sensing apparatus 450b is configured to receive only light beam 202 and/or ASE 201 for a particular measurement (e.g., beam profiling). In some embodiments, similar to first beam steering optic 432 of optical arrangement 430, first DUV dielectric mirror 462 can include a linear motor and/or actuator providing adjustment (e.g., translation, tilt, rotation, etc.) and can be adjusted to direct light beam 202 and/or ASE 201 toward second sensing apparatus 450b.

As shown in FIG. 8, an exemplary aspect of imaging apparatus 400" is sensing apparatus 450" with first sensing apparatus 450a configured to receive imaging light 206 (and/or ASE 201) and second sensing apparatus 450b configured to receive light beam 202 (and/or ASE 201). In some embodiments, first sensing apparatus 450a can be configured to receive imaging light 206 and/or ASE 201 and be optimized for far-field (FF) detection of imaging light 206 (e.g., 405 nm). For example, imaging lens position(s) 442a can be utilized for far-field (FF) profiling of imaging light 206 reflected from input/output optical element 250 (e.g., OC). In some embodiments, second sensing apparatus 450b can be configured to receive light beam 202 and/or ASE 201 and be optimized for near-field (NF) profiling of light beam 202 (e.g., 193 nm). For example, imaging lens position(s) 442b can be utilized for near-field (NF) profiling of light beam 202 at OC aperture 252, first chamber aperture 264a, second chamber aperture 264b, and/or LNM aperture 272.

First sensing apparatus 450a can be configured to receive imaging light 206 based on a position of first imaging lens 440a that corresponds to first imaging lens position(s) 442a (e.g., object plane of OC aperture 252, first chamber aperture 264a, second chamber aperture 264b, and/or LNM aperture 272). First sensing apparatus 450a can include first camera 452a and first camera neutral density (ND) filter 454a. First camera 452a can be configured to measure imaging light 206 and/or ASE 201. For example, first camera 452a can be optimized to detect a visible wavelength (e.g., 405 nm). In some embodiments, first camera 452a can sense a two-dimensional (2D) representation of imaging light 206 and/or ASE 201. In some embodiments, first camera 452a can include a charged coupled device (CCD) or a complementary metal-oxide-semiconductor (CMOS) camera. For example, first camera 452a can include a back-thinned CCD camera and/or a back-thinned CMOS camera. In some embodiments, first sensing apparatus 450a can monitor and/or measure a 2D beam profile of imaging light 206 and/or ASE 201, for example, a far-field (FF) 2D beam profile. In some embodiments, first camera ND filter 454a can include one or more wavelength filter(s).

Second sensing apparatus 450b can be configured to receive light beam 202 based on a position of second imaging lens 440b that corresponds to second imaging lens position(s) 442b (e.g., object plane of OC aperture 252, first chamber aperture 264a, second chamber aperture 264b, and/or LNM aperture 272). Second sensing apparatus 450b can include second camera 452b and second camera neutral density (ND) filter 454b. Second camera 452b can be configured to measure light beam 202 and/or ASE 201. For example, second camera 452b can be optimized to detect a DUV wavelength (e.g., 193 nm). In some embodiments, second camera 452b can sense a two-dimensional (2D) representation of light beam 202 and/or ASE 201. In some embodiments, second camera 452b can include a charged coupled device (CCD) or a complementary metal-oxide-semiconductor (CMOS) camera. For example, second camera 452b can include a back-thinned CCD camera and/or a back-thinned CMOS camera. In some embodiments, second sensing apparatus 450b can monitor and/or measure a 2D beam profile of light beam 202 and/or ASE 201, for example, a near-field (NF) 2D beam profile. In some embodiments, second camera ND filter 454b can include one or more wavelength filter(s).

Exemplary Flow Diagram

Figure 9:
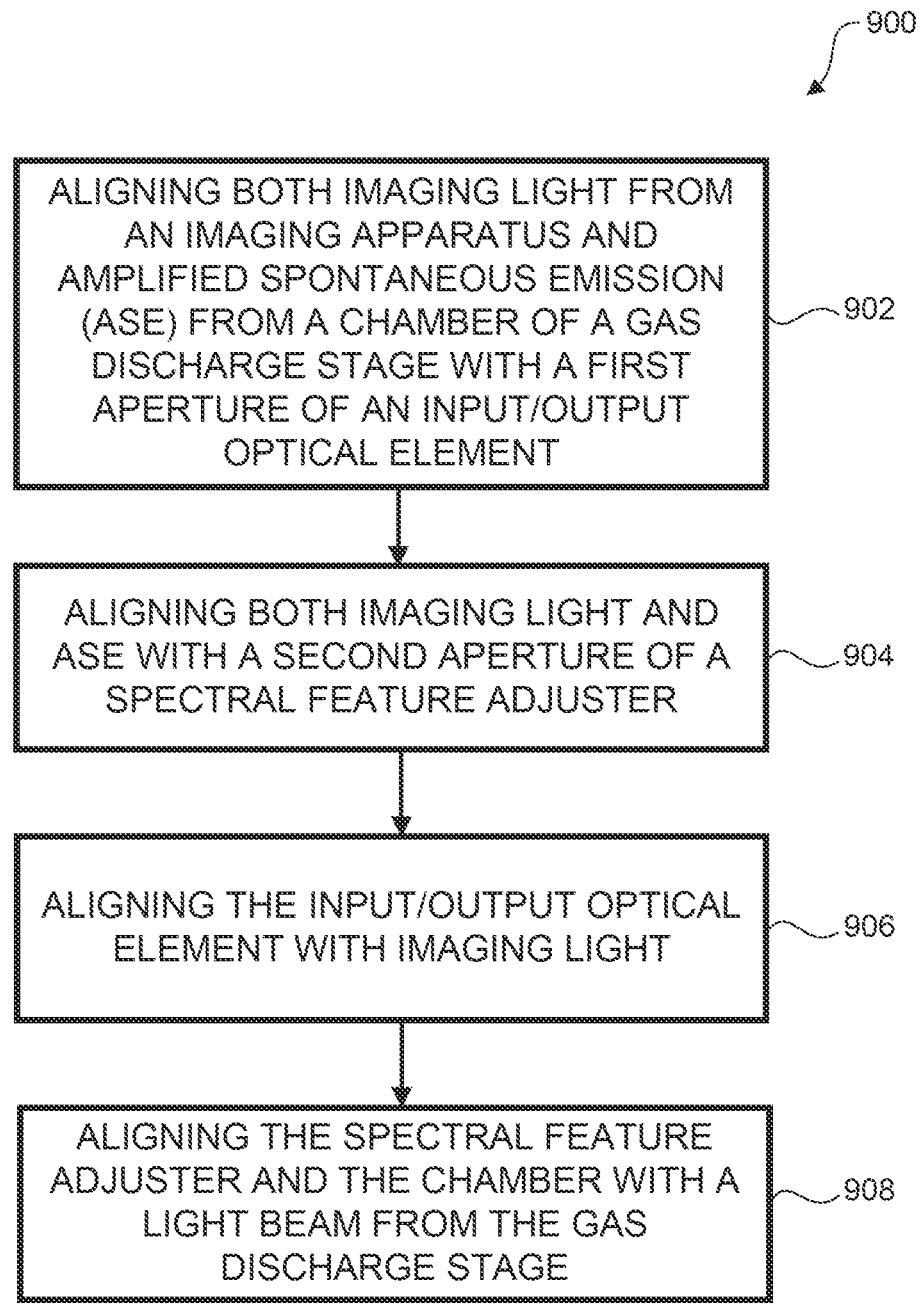
FIG. 9 illustrates a flow diagram for aligning a gas discharge stage, according to an exemplary embodiment.

FIG. 9 illustrates flow diagram 900 for aligning gas discharge stage 220, according to an embodiment. It is to be appreciated that not all steps in FIG. 9 are needed to perform the disclosure provided herein. Further, some of the steps may be performed simultaneously, sequentially, and/or in a different order than shown in FIG. 9. Flow diagram 900 shall be described with reference to FIGS. 2-5. However, flow diagram 900 is not limited to those example embodiments.

In step 902, as shown in the example of FIGS. 3 and 5, both imaging light 206 from imaging apparatus 400 and ASE 201 from chamber 261 can be aligned with OC aperture 252 of input/output optical element 250 (e.g., OC). In some embodiments, aligning both imaging light 206 and ASE 201 includes using ASE 201 as a beacon to guide boresighting imaging light 206 with an optical axis of gas discharge stage 220 and adjusting (e.g., coarse) chamber 261 along the optical axis of gas discharge stage 220. For example, imaging apparatus 400 (e.g., first and second beam steering optics 432, 438) can direct imaging light 206 onto OC aperture 252 and image ASE 201 on sensing apparatus 450 and adjust chamber 261 via chamber adjuster 265 (shown in FIG. 2) until images of OC aperture 252 and ASE 201 overlap. In some embodiments, aligning both imaging light 206 and ASE 201 includes adjusting imaging light 206 with optical arrangement 430 to center imaging light 206 on OC aperture 252. For example, first and second beam steering optics 432, 438 can be adjusted (e.g., translated, tilted, rotated, etc.) until imaging light 206 is centered on OC aperture 252 (e.g., rectangular opening) and detected by sensing apparatus 450 at an appropriate imaging lens position 442 (e.g., object plane of OC aperture 252). In some embodiments, deviation of a centroid of imaging light 206 from a center of OC aperture 252 can be less than ±0.1 mm.

In step 904, as shown in the example of FIGS. 4 and 5, both imaging light 206 from imaging apparatus 400 and ASE 201 from chamber 261 can be aligned with LNM aperture 272 of spectral feature adjuster 270 (e.g., LNM). In some embodiments, aligning both imaging light 206 and ASE 201 includes using ASE 201 as a beacon to guide boresighting imaging light 206 with an optical axis of chamber 261 and adjusting (e.g., coarse) chamber 261 along an optical axis of imaging light 206. For example, imaging apparatus 400 can direct imaging light 206 onto LNM aperture 272 and image ASE 201 on sensing apparatus 450 and adjust chamber 261 via chamber adjuster 265 (shown in FIG. 2) until images of LNM aperture 272 and ASE 201 overlap. In some embodiments, aligning both imaging light 206 and ASE 201 includes adjusting imaging light 206 with optical arrangement 430 to center imaging light 206 on LNM aperture 272. For example, first and second beam steering optics 432, 438 can be adjusted (e.g., translated, tilted, rotated, etc.) until imaging light 206 is centered on LNM aperture 272 (e.g., rectangular opening) and detected by sensing apparatus 450 at an appropriate imaging lens position 442 (e.g., object plane of LNM aperture 272). In some embodiments, deviation of a centroid of imaging light 206 from a center of LNM aperture 272 can be less than ±0.1 mm.

In step 906, as shown in the example of FIGS. 3 and 5, input/output optical element 250 (e.g., OC) can be aligned with imaging light 206. In some embodiments, aligning input/output optical element 250 (e.g., OC) includes inserting retractable retroreflector 470 into imaging light 206 and focusing imaging light 206 onto sensing apparatus 450 to define a first alignment position (e.g., X-Y digital image position). In some embodiments, aligning input/output optical element 250 (e.g., OC) includes removing retractable retroreflector 470 from imaging light 206 and adjusting first optical resonator element 254 until a far-field (FF) profile of imaging light 206 translates from a second alignment position (e.g., X-Y digital image position) on sensing apparatus 450 to the first alignment position (e.g., X-Y digital image position). For example, sensing apparatus 450 can image a far-field (FF) back reflection of imaging light 206 from input/output optical element 250 (e.g., OC) onto sensing apparatus 450 and first optical resonator element 254 can adjust (e.g., angularly) input/output optical element 250 (e.g., OC) until images of first and second alignment positions overlap. In some embodiments, deviation of a centroid of reflected imaging light 206 from input/output optical element 250 (e.g., OC) from the first alignment position (e.g., X-Y digital image position) defined using retractable retroreflector 470 can be less than ±1 pixel (e.g., less than about 25 µrad angular error).

In step 908, as shown in the example of FIGS. 2-5, spectral feature adjuster 270 (e.g., LNM) and chamber 261 can be aligned with light beam 202. In some embodiments, aligning spectral feature adjuster 270 (e.g., LNM) and chamber 261 includes profiling light beam 202 at OC aperture 252 onto sensing apparatus 450. For example, a vertical symmetry of light beam 202 at OC aperture 252 can be measured (e.g., imaging a near-field (NF) beam profile of light beam 202 at OC aperture 252), and spectral feature adjuster 270 (e.g., LNM) can be adjusted with TAM 274 until any vertical asymmetry is reduced (e.g., light beam 202 at OC aperture 252 is vertically symmetric). In some embodiments, quantifiable alignment error of vertical symmetry of light beam 202 at OC aperture 252 can be less than about ±50 µrad (angular) error.

In some embodiments, aligning spectral feature adjuster 270 (e.g., LNM) and chamber 261 includes profiling light beam 202 at OC aperture 252 onto sensing apparatus 450. For example, a horizontal symmetry of light beam 202 at OC aperture 252 can be measured (e.g., imaging a near-field (NF) beam profile of light beam 202 at OC aperture 252), and chamber 261 can be adjusted (e.g., fine) with chamber adjuster 265 (shown in FIG. 2) until any horizontal asymmetry is reduced (e.g., light beam 202 at OC aperture 252 is horizontally symmetric). In some embodiments, quantifiable alignment error of horizontal symmetry of light beam 202 at OC aperture 252 can be less than about ±50 µm (lateral) error and less than about ±50 µrad (angular) error.

In some embodiments, aligning spectral feature adjuster 270 (e.g., LNM) and chamber 261 includes profiling light beam 202 at LNM aperture 272 onto sensing apparatus 450. For example, a horizontal symmetry of light beam 202 at LNM aperture 272 can be measured (e.g., imaging a near-field (NF) beam profile of light beam 202 at LNM aperture 272), and chamber 261 can be adjusted (e.g., fine) with chamber adjuster 265 (shown in FIG. 2) until any horizontal asymmetry is reduced (e.g., light beam 202 at LNM aperture 272 is horizontally symmetric). In some embodiments, quantifiable alignment error of horizontal symmetry of light beam 202 at LNM aperture 272 can be less than about ±50 µm (lateral) error and less than about ±50 µrad (angular) error.

In some embodiments, alignment of spectral feature adjuster 270 (e.g., LNM) and chamber 261 with light beam 202 can occur simultaneously with light beam 202 being utilized in a lithographic apparatus. For example, alignment can occur simultaneously with light beam 202 and/or amplified light beam 204 being utilized in radiation source SO of lithographic apparatus LA.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments in the context of optical lithography, it will be appreciated that embodiments may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

Embodiments may be implemented in hardware, firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, and/or instructions.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments have been described above, it will be appreciated that the embodiments may be practiced otherwise than as described. The description is not intended to limit the scope of the claims.

It is to be appreciated that the Detailed Description section, and not the Summary and Abstract sections, is intended to be used to interpret the claims. The Summary and Abstract sections may set forth one or more but not all exemplary embodiments as contemplated by the inventor(s), and thus, are not intended to limit the embodiments and the appended claims in any way.

The embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the embodiments that others can, by applying knowledge within the skill of the art, readily modify and/or adapt for various applications such specific embodiments, without undue experimentation, without departing from the general concept of the embodiments. Therefore, such adaptations and modifications are intended to be within the meaning and range of equivalents of the disclosed embodiments, based on the teaching and guidance presented herein.

Other aspects of the invention are set out in the following numbered clauses.

1. A light source apparatus comprising:
a gas discharge stage comprising:
an optical amplifier comprising a chamber configured to hold a gas discharge medium, the gas discharge medium outputting a light beam; and
a set of optical elements configured to form an optical resonator around the optical amplifier;
a sensing apparatus;
an optical arrangement configured to image light from a plurality of distinct object planes within the gas discharge stage onto the sensing apparatus;
an adjustment apparatus in physical communication with one or more optical components within the gas discharge stage and configured to modify at least one geometric aspect of the optical components; and
a control apparatus in communication with the sensing apparatus and the adjustment apparatus, the control apparatus configured to provide a signal to the adjustment apparatus based on an output from the sensing apparatus.

2. The light source apparatus of clause 1, wherein the chamber of the gas discharge stage comprises a first optical port and a second optical port.

3. The light source apparatus of clause 1, wherein the set of optical elements comprises:
an input/output optical element in optical communication with a first optical port; and
a spectral feature adjuster in optical communication with a second optical port.

4. The light source apparatus of clause 1, wherein the optical arrangement includes one or more focusing optical elements that are adjustable along an optical path of the light beam to thereby select which object plane is imaged onto the sensing apparatus.

5. The light source apparatus of clause 1, wherein the sensing apparatus comprises a camera that senses a two-dimensional representation of the light beam received by the sensing apparatus.

6. The light source apparatus of clause 5, wherein the camera includes a charged coupled device (CCD) or a complementary metal-oxide-semiconductor (CMOS) camera.

7. The light source apparatus of clause 1, wherein the sensing apparatus and the optical arrangement are integrated within a three-dimensional frame that also houses the gas discharge stage.

8. The light source apparatus of clause 1, further comprising an illuminator configured to direct imaging light into the gas discharge stage.

9. An imaging apparatus comprising:
an illuminator configured to direct imaging light into a gas discharge stage outputting a light beam;
a sensing apparatus configured to receive the light beam and/or imaging light; and
an optical arrangement configured to image the light beam and/or imaging light from a plurality of distinct object planes within the gas discharge stage onto the sensing apparatus.

10. The imaging apparatus of clause 9, wherein the sensing apparatus and the optical arrangement are configured to receive amplified spontaneous emission (ASE) from the gas discharge stage for an initial calibration.

11. The imaging apparatus of clause 9, wherein the optical arrangement includes one or more focusing optical elements that are adjustable along an optical path of the light beam to thereby select which object plane is imaged onto the sensing apparatus.

12. The imaging apparatus of clause 9, wherein the sensing apparatus comprises a camera that senses a two-dimensional representation of the light beam received by the sensing apparatus.

13. The imaging apparatus of clause 12, wherein the camera includes a charged coupled device (CCD) or a complementary metal-oxide-semiconductor (CMOS) camera.

14. The imaging apparatus of clause 9, wherein the imaging apparatus is integrated within a three-dimensional frame that also houses the gas discharge stage.

15. A method of aligning a gas discharge stage outputting a light beam and comprising a chamber having a first optical port and a second optical port, an input/output optical element in optical communication with the first optical port, and a spectral feature adjuster in optical communication with the second optical port, the method comprising:
aligning both imaging light from an imaging apparatus and amplified spontaneous emission (ASE) from the chamber with:
a first aperture of the input/output optical element; and
a second aperture of the spectral feature adjuster;
aligning the input/output optical element at the first aperture with imaging light; and
aligning the spectral feature adjuster at the second aperture and the chamber with the light beam.

16. The method of clause 15, wherein the aligning both imaging light and ASE comprises using ASE as a beacon to guide boresighting imaging light with an optical axis of the gas discharge stage and coarsely adjusting the chamber along the optical axis of the gas discharge stage.

17. The method of clause 15, wherein the aligning both imaging light and ASE comprises adjusting imaging light with an optical arrangement to center imaging light on first and second apertures.

18. The method of clause 15, wherein the aligning the input/output optical element at the first aperture comprises inserting a retroreflector into imaging light and focusing imaging light onto a sensing apparatus to define a first alignment position.

19. The method of clause 18, wherein the aligning the input/output optical element at the first aperture comprises removing the retroreflector and adjusting the input/output optical element at the first aperture to align a back reflection of imaging light onto the sensing apparatus from a second alignment position to the first alignment position.

20. The method of clause 18, wherein the aligning the input/output optical element at the first aperture comprises imaging a far-field back reflection of imaging light from the input/output optical element at the first aperture onto the sensing apparatus.

21. The method of clause 15, wherein the aligning the spectral feature adjuster at the second aperture and the chamber comprises profiling the light beam at the first aperture and/or at the second aperture onto a sensing apparatus.

22. The method of clause 21, wherein the profiling the light beam comprises measuring a vertical symmetry of the light beam at the first aperture and adjusting the spectral feature adjuster at the second aperture with a tilt angular modulator (TAM).

23. The method of clause 22, wherein the measuring the vertical symmetry comprises imaging a near-field beam profile of the light beam at the first aperture.

24. The method of clause 21, wherein the profiling the light beam comprises measuring a horizontal symmetry of the light beam at the first aperture and finely adjusting the chamber.

25. The method of clause 24, wherein the measuring the horizontal symmetry comprises imaging a near-field beam profile of the light beam at the first aperture.

26. The method of clause 21, wherein the profiling the light beam comprises measuring a horizontal symmetry of the light beam at the second aperture and finely adjusting the chamber.

27. The method of clause 26, wherein the measuring the horizontal symmetry comprises imaging a near-field beam profile of the light beam at the second aperture.

28. The method of clause 15, wherein the aligning the spectral feature adjuster at the second aperture and the chamber occurs simultaneously with the light beam being utilized in a lithographic apparatus.

The breadth and scope of the embodiments should not be limited by any of the above-described exemplary embodiments, but should be defined only in accordance with the following claims and their equivalents.

What is claimed is:

1. A light source apparatus comprising:
a gas discharge stage comprising:
an optical amplifier comprising a chamber configured to hold a gas discharge medium, the gas discharge medium outputting a light beam; and
a set of optical elements configured to form an optical resonator around the optical amplifier;
a sensing apparatus;
an optical arrangement configured to image light from a plurality of distinct object planes within the gas discharge stage onto the sensing apparatus, wherein the optical arrangement includes one or more focusing optical elements that are adjustable along an optical path of the light to be imaged to thereby select which object plane within the gas discharge stage is imaged onto the sensing apparatus;
an adjustment apparatus in physical communication with one or more optical components within the gas discharge stage and configured to modify at least one geometric aspect of the optical components; and
a control apparatus in communication with the sensing apparatus and the adjustment apparatus, the control apparatus configured to provide a signal to the adjustment apparatus based on an output from the sensing apparatus.

2. The light source apparatus of claim 1, wherein the chamber of the gas discharge stage comprises a first optical port and a second optical port.

3. The light source apparatus of claim 1, wherein the set of optical elements comprises:
an input/output optical element in optical communication with a first optical port; and
a spectral feature adjuster in optical communication with a second optical port.

4. The light source apparatus of claim 1, wherein the sensing apparatus comprises a camera that senses a two-dimensional representation of the light beam received by the sensing apparatus.

5. The light source apparatus of claim 4, wherein the camera includes a charged coupled device (CCD) or a complementary metal-oxide-semiconductor (CMOS) camera.

6. The light source apparatus of claim 1, further comprising an illuminator distinct from a gas discharge stage and configured to direct imaging light into the gas discharge stage.

7. The light source of claim 6, wherein the optical arrangement is further configured to adjust the one or more focusing optical elements along an optical path of the imaging light from the illuminator to thereby select which object plane within the gas discharge stage is imaged onto the sensing apparatus.

8. The light source of claim 1, wherein the optical arrangement further includes an actuator for displacing the one or more focusing optical elements along the optical path of the light beam to thereby select which object plane within the gas discharge stage is imaged onto the sensing apparatus.

9. The light source of claim 1, wherein the gas discharge stage further outputs an amplified spontaneous emission (ASE), and wherein the light source further includes a second sensing apparatus and a second optical arrangement configured to image light from a plurality of distinct object planes within the gas discharge stage onto the second sensing apparatus, wherein the second optical arrangement includes one or more focusing optical elements that are adjustable along an optical path of the ASE to thereby select which object plane within the gas discharge stage is imaged onto the second sensing apparatus.

10. The light source of claim 9, wherein the second optical arrangement further includes a second actuator for displacing the one or more focusing optical elements of the second optical arrangement along the optical path of the ASE to thereby select which object plane within the gas discharge stage is imaged onto the sensing apparatus.

11. An imaging apparatus comprising:
an illuminator configured to direct imaging light into a gas discharge stage outputting a light beam, the illuminator distinct from a gas discharge stage;
a sensing apparatus; and
an optical arrangement configured to selectively image the light beam from the gas discharge stage and the imaging light from the illuminator from a plurality of distinct object planes within the gas discharge stage onto the sensing apparatus, wherein the optical arrangement includes one or more focusing optical elements that are adjustable along an optical path to thereby select which object plane within the gas discharge stage is imaged onto the sensing apparatus.

12. The imaging apparatus of claim 11, wherein the sensing apparatus and the optical arrangement are configured to receive amplified spontaneous emission (ASE) from the gas discharge stage for an initial calibration.

13. The imaging apparatus of claim 11, wherein the sensing apparatus comprises a camera that senses a two-dimensional representation of the light beam received by the sensing apparatus, wherein the camera includes a charged coupled device (CCD) or a complementary metal-oxide-semiconductor (CMOS) camera.

14. A method of aligning a gas discharge stage outputting a light beam and comprising a chamber having a first optical port and a second optical port, an input/output optical element in optical communication with the first optical port, and a spectral feature adjuster in optical communication with the second optical port, the method comprising:

aligning both imaging light from an imaging apparatus and amplified spontaneous emission (ASE) from the chamber with:
a first aperture of the input/output optical element; and
a second aperture of the spectral feature adjuster;
aligning the input/output optical element at the first aperture with imaging light; and
aligning the spectral feature adjuster at the second aperture and the chamber with the light beam.

15. The method of claim 14, wherein the aligning both imaging light and ASE comprises using ASE as a beacon to guide boresighting imaging light with an optical axis of the gas discharge stage and coarsely adjusting the chamber along the optical axis of the gas discharge stage.

16. The method of claim 14, wherein the aligning the input/output optical element at the first aperture comprises inserting a retroreflector into imaging light and focusing imaging light onto a sensing apparatus to define a first alignment position.

17. The method of claim 16, wherein the aligning the input/output optical element at the first aperture comprises removing the retroreflector and adjusting the input/output optical element at the first aperture to align a back reflection of imaging light onto the sensing apparatus from a second alignment position to the first alignment position.

18. The method of claim 16, wherein the aligning the input/output optical element at the first aperture comprises imaging a far-field back reflection of imaging light from the input/output optical element at the first aperture onto the sensing apparatus.

19. The method of claim 14, wherein the aligning the spectral feature adjuster at the second aperture and the chamber comprises profiling the light beam at the first aperture and/or at the second aperture onto a sensing apparatus.

20. The method of claim 19, wherein the profiling the light beam comprises measuring a vertical symmetry of the light beam at the first aperture and adjusting the spectral feature adjuster at the second aperture with a tilt angular modulator (TAM).

21. The method of claim 19, wherein the profiling the light beam comprises measuring a horizontal symmetry of the light beam at the first aperture and finely adjusting the chamber, wherein the measuring the horizontal symmetry comprises imaging a near-field beam profile of the light beam at the first aperture.

22. The method of claim 19, wherein the profiling the light beam comprises measuring a horizontal symmetry of the light beam at the second aperture and finely adjusting the chamber, wherein the measuring the horizontal symmetry comprises imaging a near-field beam profile of the light beam at the second aperture.

* * * * *

UNITED STATES PATENT AND TRADEMARK OFFICE
CERTIFICATE OF CORRECTION

PATENT NO. : 12,332,569 B2
APPLICATION NO. : 17/783351
DATED : June 17, 2025
INVENTOR(S) : Zhong Quan Zhao Page 1 of 1

It is certified that error appears in the above-identified patent and that said Letters Patent is hereby corrected as shown below:

On the Title Page

Column 2 (57), Abstract, Line 14: after "is" insert --in--.

In the Claims

Column 24, Line 65, Claim 7: after "source" insert --apparatus--;

Column 25, Line 4, Claim 8: after "source" insert --apparatus--;

Column 25, Line 9, Claim 9: after "source" insert --apparatus--;

Column 25, Line 20, Claim 10: after "source" insert --apparatus--.

Signed and Sealed this
Thirteenth Day of January, 2026

John A. Squires
*Director of the United States Patent and Trademark Office*